(12) United States Patent
Kelly et al.

(10) Patent No.: US 11,101,652 B2
(45) Date of Patent: Aug. 24, 2021

(54) MONITORING ELECTRICAL SUBSTATION NETWORKS

(71) Applicant: Intel Corporation, Santa Clara, CA (US)

(72) Inventors: Damian Kelly, Naas (IE); David Boundy, Bishopstown (IE)

(73) Assignee: Intel Corporation, Santa Clara, CA (US)

( * ) Notice: Subject to any disclaimer, the term of this patent is extended or adjusted under 35 U.S.C. 154(b) by 329 days.

(21) Appl. No.: 16/307,369

(22) PCT Filed: Jul. 1, 2016

(86) PCT No.: PCT/US2016/040722
§ 371 (c)(1),
(2) Date: Dec. 5, 2018

(87) PCT Pub. No.: WO2018/004661
PCT Pub. Date: Jan. 4, 2018

(65) Prior Publication Data
US 2019/0296547 A1   Sep. 26, 2019

(51) Int. Cl.
*G06F 11/30* (2006.01)
*H02J 3/00* (2006.01)
*G06N 20/00* (2019.01)
*G06F 16/2455* (2019.01)
*H04L 29/08* (2006.01)
(Continued)

(52) U.S. Cl.
CPC .............. *H02J 3/00* (2013.01); *G06F 11/30* (2013.01); *G06F 11/34* (2013.01); *G06F 16/2455* (2019.01); *G06F 30/20* (2020.01); *G06N 20/00* (2019.01); *H04L 67/12* (2013.01); *G01W 1/10* (2013.01); *H02J 3/003* (2020.01); *H02J 2203/20* (2020.01); *Y02E 60/00* (2013.01); *Y04S 10/30* (2013.01); *Y04S 40/18* (2018.05)

(58) Field of Classification Search
CPC ...................................................... H02J 3/00
See application file for complete search history.

(56) References Cited

U.S. PATENT DOCUMENTS

2013/0268196 A1   10/2013   Dam
2015/0046221 A1*   2/2015   Narayan ................ H02J 3/008
                                                                    705/7.31

FOREIGN PATENT DOCUMENTS

CN   101908176 A   12/2010
WO   2018004661      1/2018

OTHER PUBLICATIONS

Ran Li et al. "Development of Low Voltage Network Templates—Par I: Substation Clustering and Classification." IEEE Transactions on Power Systems, vol. 30, No. 6, pp. 3036-3043. Nov. 2015. See p. 3037, left column, line 26—p. 3043, left column, line 35; table I; and Figs. 2 and 7-10. (Year: 2015).*

(Continued)

*Primary Examiner* — Phuong Huynh
(74) *Attorney, Agent, or Firm* — Schwegman Lundberg & Woessner, P.A.

(57) ABSTRACT

Systems and a method for forecasting data at noninstrumented substations from data collected at instrumented substations is provided. An example method includes determining a cluster id for a noninstrumented substation, creating a model from data for instrumented substations having the cluster id, and forecasting the data for the noninstrumented station from the model.

23 Claims, 18 Drawing Sheets

(51) Int. Cl.
　　　*G06F 11/34*　　　　(2006.01)
　　　*G06F 30/20*　　　　(2020.01)
　　　*G01W 1/10*　　　　(2006.01)

(56)　　　　　References Cited

OTHER PUBLICATIONS

International Search Report for related PCT Application /US2016/040722 filed Jul. 1, 2016 dated May 31, 2017, 4 pages.

Jelena Dragovic et al. "Application of Distribution System State Estimation on Engineering Instrumentation Zones of Low Carbon London." In: 23rd International Conference on Electricity Distribution, Paper 1510. Jun. 15-18, 2015 Retrieved from <http://cired.net/publications/cired2015/papers/CIRED2015_1510_final.pdf>See p. 2, left column, lines 49-57; and p. 5, left column, lines 1-8.

Ran Li et al. "Development of Low Voltage Network Templates—Part I: Substation Clustering and Classification." IEEE Transactions on Power Systems, vol. 30, No. 6, pp. 3036-3044. Nov. 2015 See p. 3037, left column, line 26—p. 3043, left column, line 35; table I; and figures 2 and 7-10.

"International Application Serial No. PCT US2016 040722, Written Opinion dated May 31, 2017", 11 pgs.

"International Application Serial No. PCT US2016 040722, International Preliminary Report on Patentability dated Jan. 10, 2019", 13 pgs.

* cited by examiner

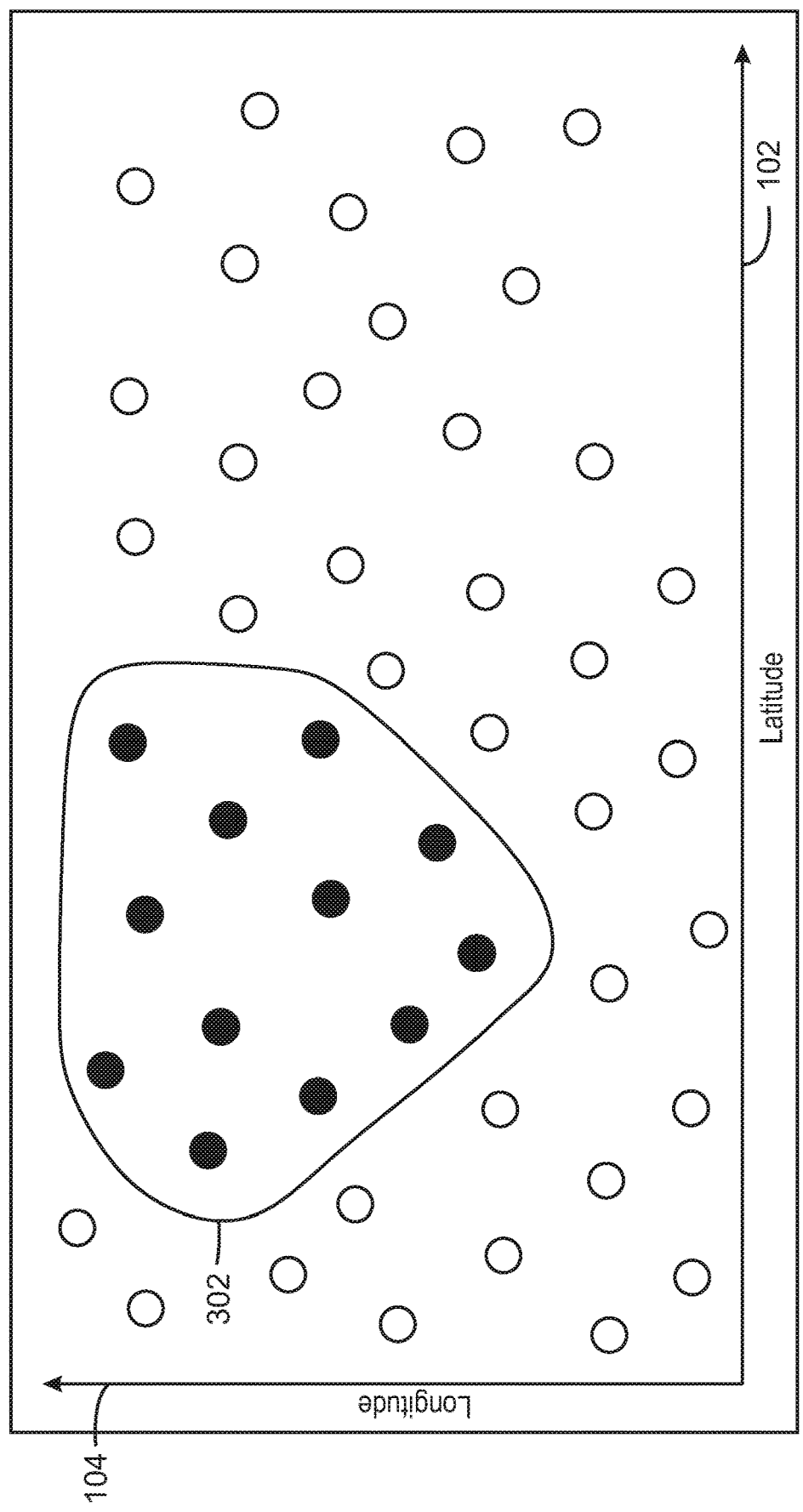

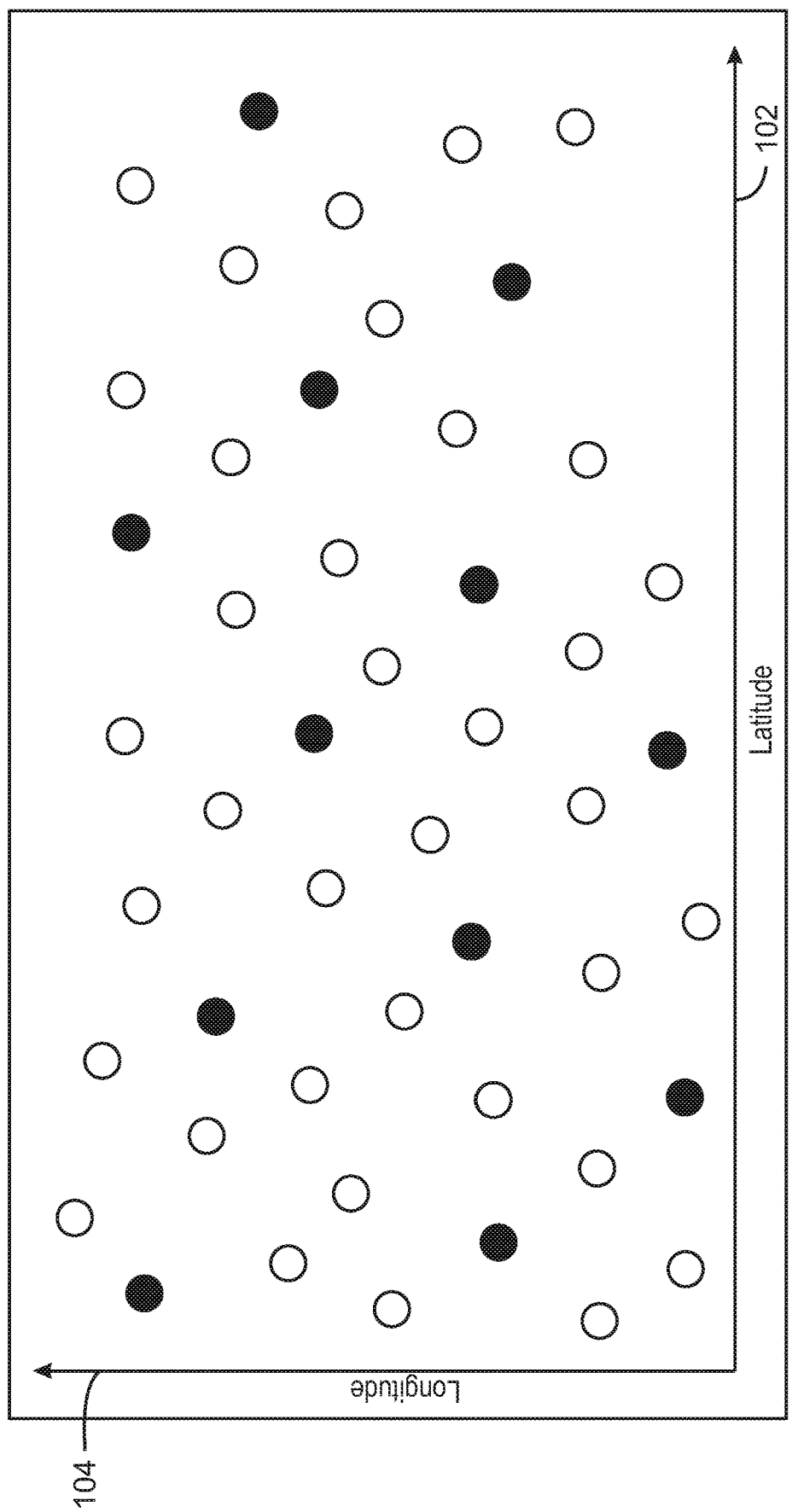

MONITORING ELECTRICAL SUBSTATION NETWORKS

CROSS REFERENCE TO RELATED APPLICATIONS

Pursuant to 35 U.S.C. § 371, this application is the United States National Stage Application of International Patent Application No. PCT/US2016/040722, filed Jul. 1, 2016, the contents of which are incorporated by reference as if set forth in their entirety herein.

TECHNICAL FIELD

The present techniques relate generally to Internet of Things (IoT) devices. More specifically the present techniques relate to devices that can monitor electrical substations.

BACKGROUND

It has been estimated that the Internet of Things (IoT) may bring Internet connectivity to 50 billion devices by 2020. For organizations, IoT devices may provide opportunities for monitoring and tracking other devices and items, including devices in industrial implementations. For example, IoT devices may be used to monitor loads and function in electrical distribution systems.

BRIEF DESCRIPTION OF THE DRAWINGS

FIG. 3 is a map of a sparse sub-optimal deployment.

FIG. 4 is a map of more optimal deployment, showing an even distribution of instrumented substations.

The same numbers are used throughout the disclosure and the figures to reference like components and features. Numbers in the 100 series refer to features originally found in FIG. 1; numbers in the 200 series refer to features originally found in FIG. 2; and so on.

DESCRIPTION OF THE EMBODIMENTS

Figure 1:
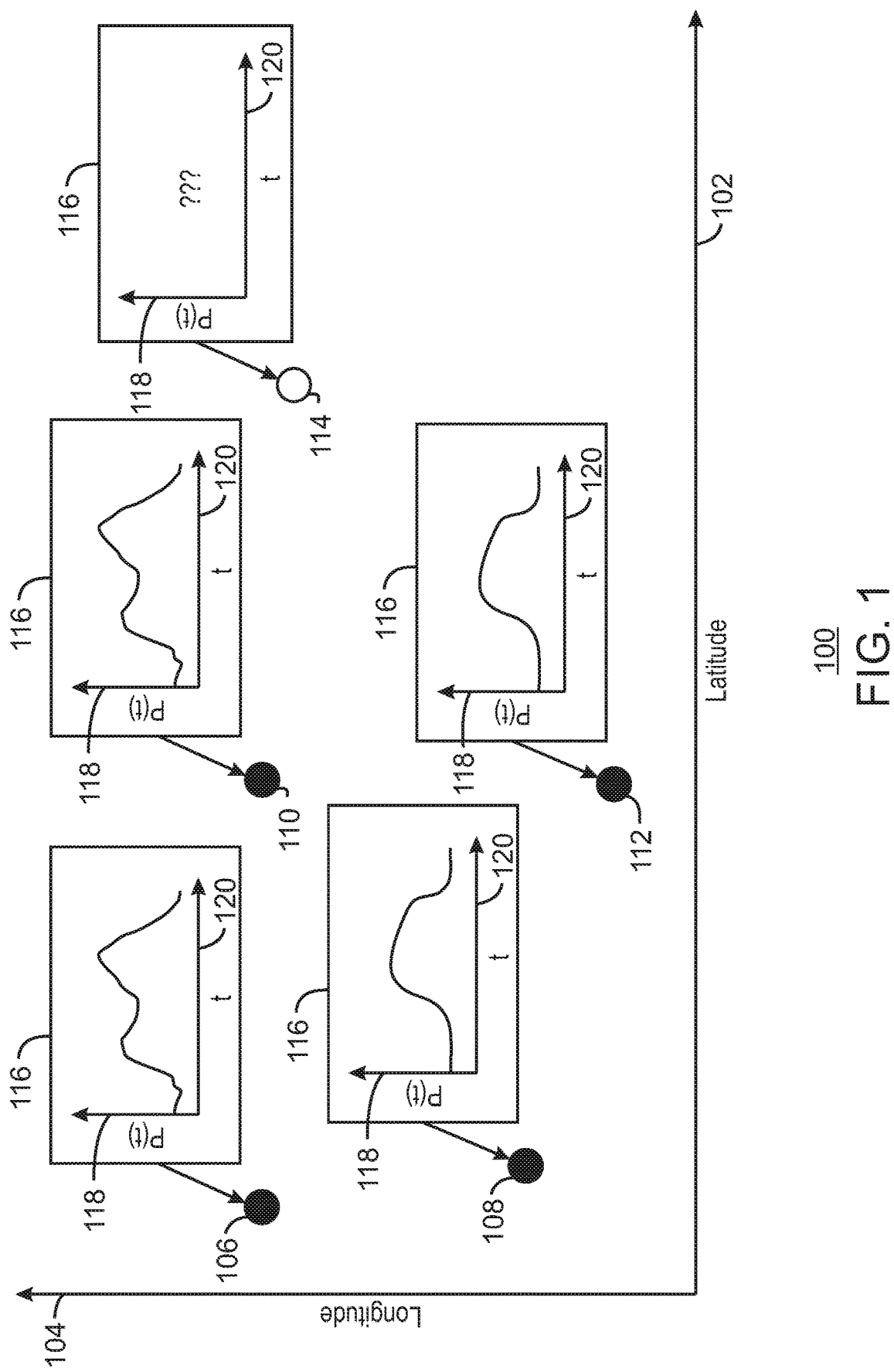
FIG. 1 is a map of an electrical substation forecasting deployment by latitude and longitude.

The internet of things (IoT) is a concept in which a large number of computing devices are interconnected to each other and to the Internet to provide functionality and data acquisition at very low levels. For example, IoT networks may include commercial and home automation devices, such as water distribution systems, pipeline control systems, plant control systems, light switches, thermostats, locks, cameras, alarms, motion sensors, and the like. These devices, termed IoT devices herein, may be accessible through remote computers, servers, and other systems, for example, to control systems or access data. In one example, IoT devices may be used to monitor electric power distribution systems by instrumenting electrical substations to monitor current, voltage, and other parameters that may be used to track power demand. A substation includes a grouping of transformers at a terminus of a high voltage line to step down the high voltage to lower levels for local feeder lines, for example, from 220 kilovolt (kV) to 66 kV, among others. However, as used herein, the term may include any other units in a power distribution system, such as smaller transformers feeding housing subdivisions or city blocks, local transformers, electrical lines, and the like.

Monitoring the load at electrical distribution substations allows grid stakeholders to better understand and plan the utilization and capacity of the electrical grid infrastructure. The resulting load data also allows analytics algorithms to be deployed to forecast the future active and reactive power demand on the substations. However, instrumentation may often be placed at all substations for which forecasts are required, increasing costs. The techniques discussed herein allow a sparse distribution of instrumentation across substations to be used to provide load forecasts across instrumented and noninstrumented substations.

Unsupervised machine learning techniques are used to determine which instrumented substations are the most representative of the behavior of a noninstrumented substation. Then data from the relevant instrumented substations may then be combined with external data sources, such as data from temperature sensors, humidity sensors, weather predictions, and the like. The combined data may then be used in models, for example, generated by supervised machine learning techniques, to provide forecasts of the power consumption of substations which do not have instrumentation. The benefit to the information consumer is that full smart grid analytics may be enabled with reduced deployments costs, since only a subset of substations need to be instrumented.

In addition to predicting values for noninstrumented substations, the techniques provide methods for planning for the deployment of the system. The optimal deployment strategy may maximize forecasting performance across the entire sparsely instrumented smart grid, for example, determining which substations should have instrumentation. The level of forecasting performance expected for a particular investment in smart grid instrumentation may be estimated, for example, to decrease the likelihood of overspending on the instrumentation.

This deployment prediction includes a smart grid deployment forecasting optimization system and associated calculation techniques. These systems and techniques allow a stakeholder to generate optimal sparse instrumentation deployment strategies and estimate in advance how much investment is needed to achieve a prescribed level of forecasting performance, based on statistical models from previous deployment data. Thus, full smart grid analytics may be enabled with reduced deployments costs, since only a subset of substations may be instrumented.

The smart grid deployment forecasting method includes a combination of a system and algorithms to generate deployment planning tools, such as graphs, lookup tables, spreadsheets, and the like, for utility stakeholders. Generally, the systems use historical deployment data from previous deployments to generate forecast performance data for suboptimal and optimal subsets sets of instrumented substations throughout the grid for various levels of deployment budget. Models are built on the resulting performance-budget data to allow smart grid stakeholders to determine a predicted forecast accuracy performance as a function of an available instrumentation budget.

FIG. 1 is a map 100 of an electrical substation forecasting deployment by latitude 102 and longitude 104. In this example, a number of substations 106-112 are instrumented with power sensing equipment, such as sensors to determine active power, reactive power, voltage, current, harmonic energies, and the like. However, substation 114 is not instrumented. The power sensing equipment allows a determination of power profiles 116, which are plots of the power demand 118 against time 120. The techniques described allows the power profile 116 at substation 114 to be forecasted, in addition to forecasting the other data types which exist for the instrumented substations 106-112.

All substations 106-114 have metadata which represents the characteristics of the substation. The data may be available from the databases owned by the utility and other sources, and may include substation locations, grid topology data, official utility region classifications, substation sizing planning data, census data, and the like. Since all substations, both instrumented and noninstrumented, have metadata available, unsupervised machine learning techniques may be applied to the metadata to determine which substations are most similar to each other and group all substations by similarity.

In the example in FIG. 1, substations 106 and 110 have similar shape power profiles and substations 108 and 112 have similar shape power profiles. For example, substations 106 and 110 may be located in primarily residential areas and substations 108 and 112 may be located in primarily industrial areas. The metadata for both instrumented substations 106-112 and noninstrumented substations 114, may include the proportion of industrial and residential loads each substation 106-114 services. If the substations 106-114 are grouped by the available metadata features, substation 114 would be assigned to one of the other groups according to which substations are most similar across all features, as discussed with respect to FIG. 12. Once substation 114 has been grouped with the appropriate instrumented substations, supervised machine learning may be used to build forecasting models for substation 114 using the data from the instrumented substations with which it was grouped. The resulting 'virtual' model generated for substation 116 has predictive performance that may be as useful as if substation 114 was fully instrumented, with no instrumentation cost.

Figure 2:
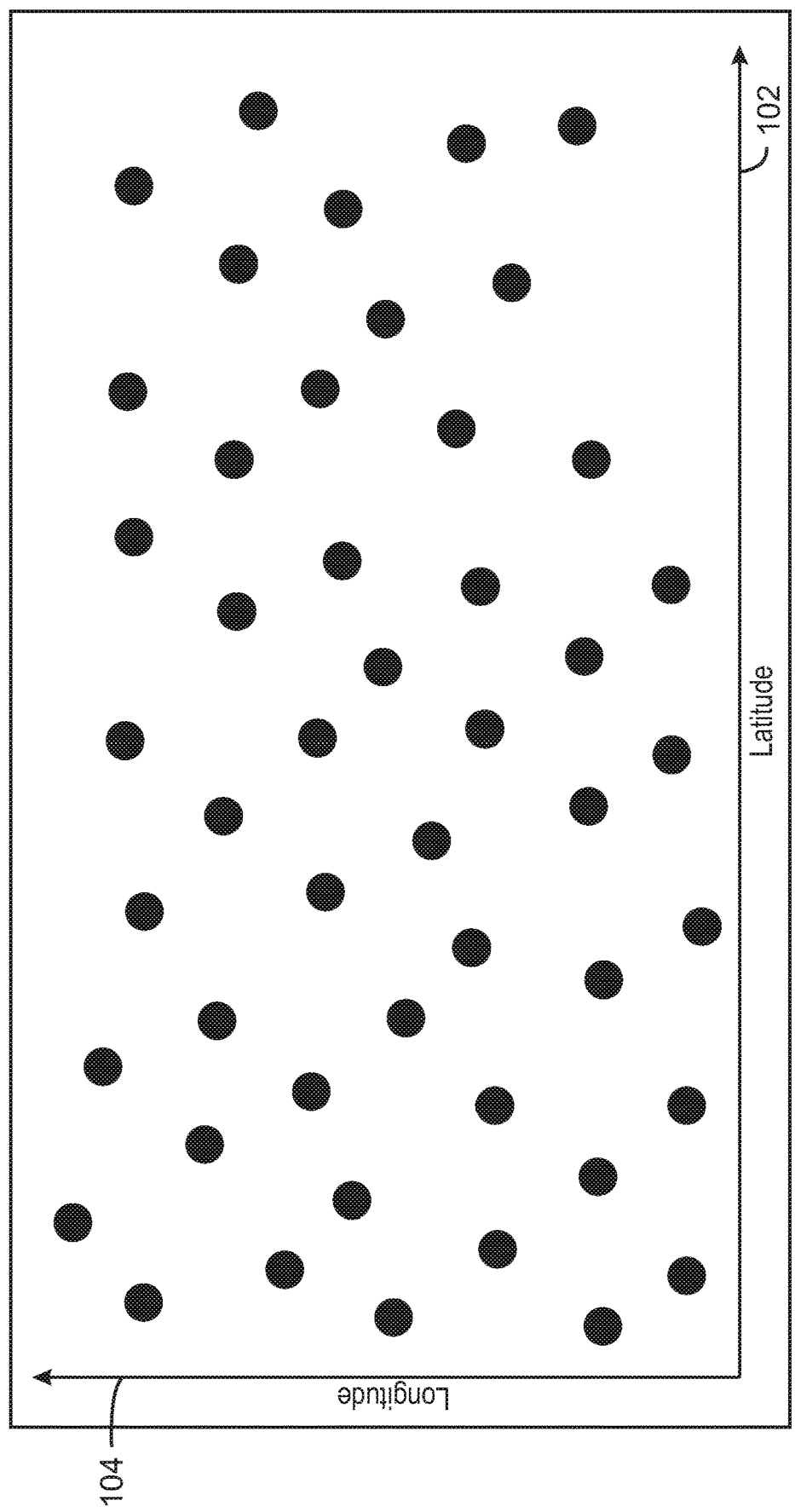
FIG. 2 is a map of a full deployment as indicated by the filled circles.

FIG. 2 is a map of a full deployment 200 as indicated by the filled circles. Like numbered items are as described with respect to FIG. 1. The state of the art in electrical substation forecasting is to instrument all substations of interest. If the electrical grid stakeholders wish to forecast the load at a new substation, they need to invest in instrumenting the substation and tolerate initial periods of inaccurate forecasts due to insufficient historical data available for that substation.

Since full deployment and sparse deployment both provide forecasts for all substations, the average substation performance is defined to be the average forecasting performance across all substations, regardless of whether they are instrumented or noninstrumented. Similarly, the average cost is the average cost to deploy the load forecasting algorithms to all substations, including both instrumented and noninstrumented substations. For example, if twice as many substations are instrumented, the average cost per forecastable substation doubles.

In the full deployment example, the average substation performance may be at about 5%, which is mainly from the error of the instruments themselves. To provide a comparison point, the average cost in this example may be about $1000.

FIG. 3 is a map of a sparse sub-optimal deployment 300. Like numbered items are as described with respect to FIG. 1. In the sub-optimal deployment 300 the instrumentation is deployed in a tight cluster 302, providing a poor representation of the entire grid's behavior. The average cost may be lower, for example, at about $250 per substation, but the average error is substantially higher, for example, at about 30%.

By running simulations and optimizations on data from various previous deployments, the techniques described herein allow a grid stakeholder to assess the levels of performance that may be achieved for a given level of investment. Further, the techniques allow a stakeholder to compare deployment strategies that improved forecasting performance in previous deployments. This information may be used to plan sparse infrastructure deployment and expected costs to obtain acceptable error levels for a given cost.

FIG. 4 is a map of more optimal deployment 400, showing an even distribution of instrumented substations. Like numbered items are as described with respect to FIG. 1. In this deployment, the average cost is also around $250 per substation, but the average error, at about 10%, is substantially lower. Thus, the grid stakeholders do not need to instrument all of the substations to get load forecasts for all substations.

As described with respect to FIGS. 2-4, sparse deployments lead to lower performance, but allow deployments at reduced costs. In the more optimal deployment 400 of FIG. 4, the performance is reduced by a factor of two, but the total cost of deployment is reduced by a factor of four. Thus, smart grid stakeholders may significantly reduce their total cost of deployment by accepting lower forecasting accuracy.

As no forecasts can be 100% accurate, due to instrument error and other factors, a smart grid stakeholder may be able to choose what level of accuracy is acceptable for a given price point. Techniques herein describe a system to enable a grid stakeholder to intuitively assess this cost-vs.-accuracy tradeoff and choose their necessary level of instrumentation. But, core to that innovation is the methods and system in this invention to enable forecasting at noninstrumented substations.

To enable electrical substation forecasting in the presence of sparse instrumentation, the techniques described specify a system architecture and three combined algorithms to forecast future load over time for substations which are not instrumented. The techniques couple a data ingestion and machine-learning system with a unique combination of machine learning algorithms that are tailored for the use-case. The next sections will describe each of these components in turn.

Further, as described herein, the techniques enable a determination of which substations should be instrumented to achieve the desired levels of predictive performance. To achieve this, the techniques are extended by a subsystem that can perform simulations of the achievable performance when different substations are instrumented. The simulations may be used to determine the optimal selection of instrumented substations. The extended system is coupled with algorithms to model and communicate the predictive performance achievable for a grid deployment.

Figure 5A:
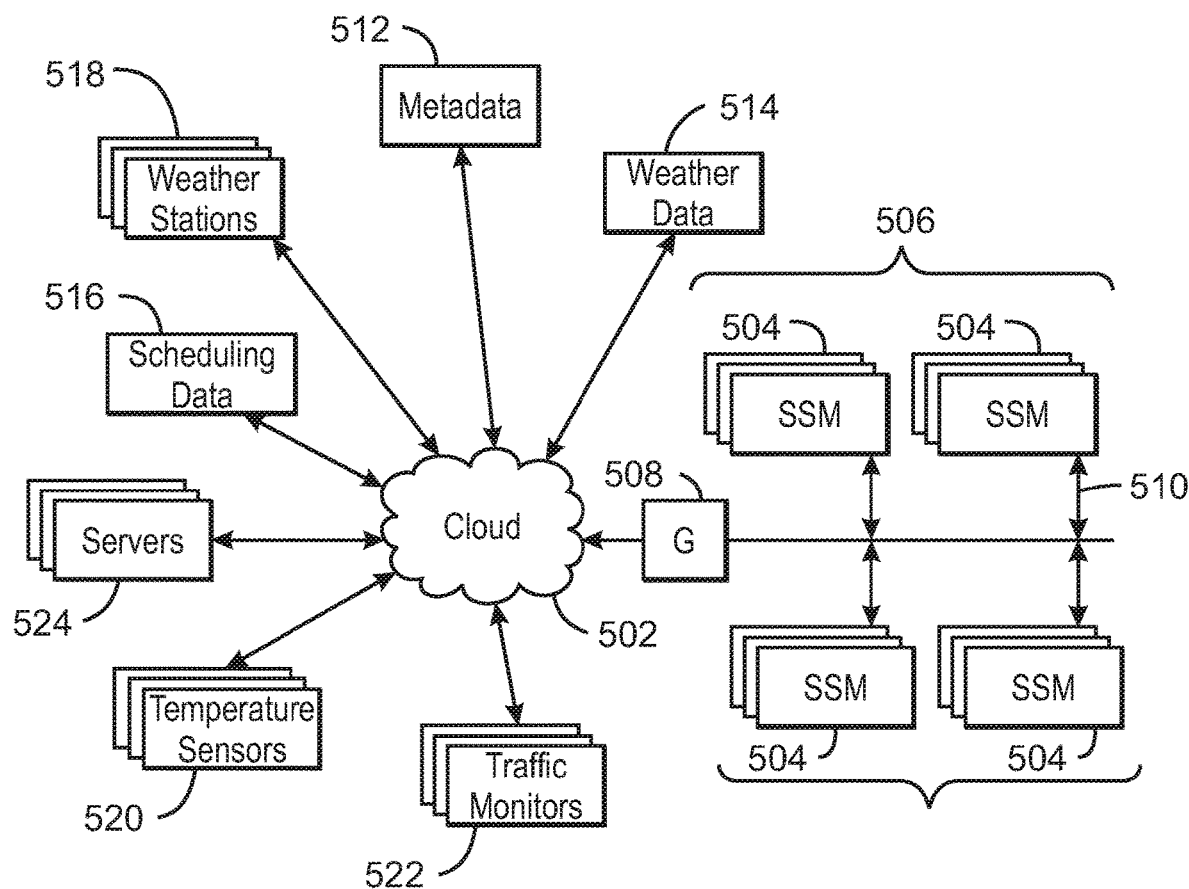
FIG. 5A is a drawing of a computing network including a computing cloud, that may be used to monitor electrical substations.

FIG. 5A is a drawing of a computing network 500 including a computing cloud 502, that may be used to monitor electrical substations. The cloud 502 may include a local area network (LAN), a wide area network (WAN), or the Internet.

The electrical substations may be monitored by IoT devices, e.g., substation monitors (SSMs) 504, that are clustered into a group 506, for example, by distribution system or region, among others. The SSMs 504 may communicate with a gateway 508 over a network 510, which may be provided by radio communications, a wired network, or any combinations. For example, a network 510 may be used to communicate with SSMs 504 in a particular substation or area, while a radio network, such as a satellite uplink, a low power wide area network (LPWAN), an LTE network, and the like, may be used for communications between the gateway 508 and the cloud 502.

As noted, the forecasting techniques may use any number of other data sources. These may include, for example, a metadata database 512, a weather database 514, and a scheduling database 516, among others. The metadata database 512 may provide the metadata about particular substations, as described herein. The weather database 514 may provide current weather information across a region, as well as forecasts. The scheduling database 516 may provide work and holiday schedules for industries and regions. Any of these databases 512-116 may be associated with private or governmental organizations.

The computing network 500 may also include any number of different types of IoT devices for providing other types of data to the forecasting system. The IoT devices may include remote weather substations 518, temperature sensors 520, traffic flow monitors 522, and any number of other devices, such as home thermostats. The IoT devices may be communicating through the cloud 502 with a server 524, for example, to predict substation performance for a noninstrumented substation or to predict the best locations for instrumenting substations.

The computing network 500 does not have to be a linear communications network, but may include a mesh network or fog of devices. This is described further with respect to FIG. 5B.

Figure 5B:
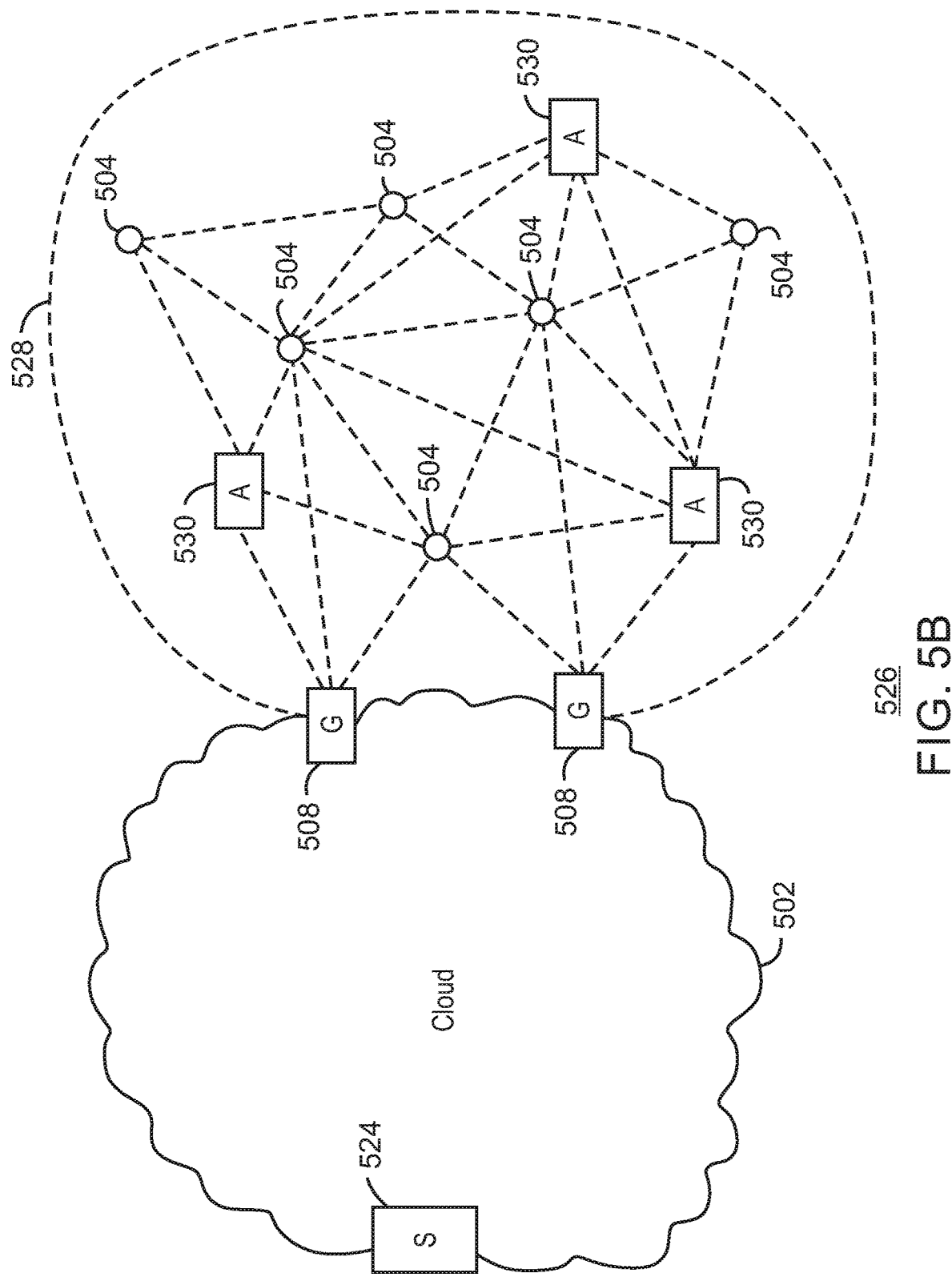
FIG. 5B is a drawing of a computing network including a computing cloud, in communication with a mesh network of IoT devices, which may be termed a fog 528, operating at the edge of the cloud.

FIG. 5B is a drawing of a computing network 526 including a computing cloud 502, in communication with a mesh network of IoT devices, which may be termed a fog 528, operating at the edge of the cloud 502. The fog 528 may be considered to be a massively interconnected network wherein a number of IoT devices are in communications with each other and with the gateways 508, for example, by radio links (shown as dashed lines). The radio communications may be implemented by radios compliant with the IEEE 802.22 standard for wireless regional networks, compliant with the IEEE 802.15.4 standard for low power wide area networks, and the like.

The communications may be performed using the open interconnect consortium (OIC) standard specification 1.0 released by the Open Connectivity Foundation™ (OCF) on Dec. 23, 2015. This standard allows devices to discover each other and establish communications for interconnects. Other interconnection protocols may also be used, including, for example, MQTT, CoAP, and the like.

The fog 528 may include any number of different IoT devices. For example, three types of IoT devices are shown in the fog 528 of FIG. 5B, gateways 508, SSMs 504, and data aggregators 530. However, any combinations of IoT devices and functionality may be used. The data aggregators 530 may be included to collect and process data from the SSMs 504, providing local computing support and data storage in the fog 528. This may be useful for locating the prediction service, for example, as described with respect to FIG. 6, within the fog 528. In some examples, the data aggregators 530 may be omitted, and the SSMs 504 handle all of the functions in the fog 528. In this example, the prediction service may be located in the server 524, or in other systems in the cloud 502.

The gateways 508 are the edge devices that provide communications between the cloud 502 and the fog 528. The fog 528 of the IoT devices may be presented to devices in the cloud 502, such as a server 524, as a single device located at the edge of the cloud 502, for example, as a fog 528 device. In this example, the alerts coming from the fog 528 device may be sent without being identified as coming from a specific IoT device within the fog 528. For example, a prediction may indicate a power demand for a substation, but may not necessarily identify whether the prediction is based on an instrumented substation, a noninstrumented substation, or a substation whose instrumentation has failed. This information may be presented as lower level or "drill down" information in a user interface.

In some examples, the IoT devices may be configured using an imperative programming style, for example, with each IoT device having a specific function. However, the IoT devices forming the fog 528 device may be configured in a declarative programming style, allowing the IoT devices to reconfigure their operations and communications to determine the resources needed to respond to conditions, queries, and device failures. For example, a query from a user located at a server 524 about the power demand at a substation may result in the fog 528 device selecting the IoT devices, such as the gateways 508, data aggregators 530, or SSMs 504, needed to answer the query.

Figure 6:
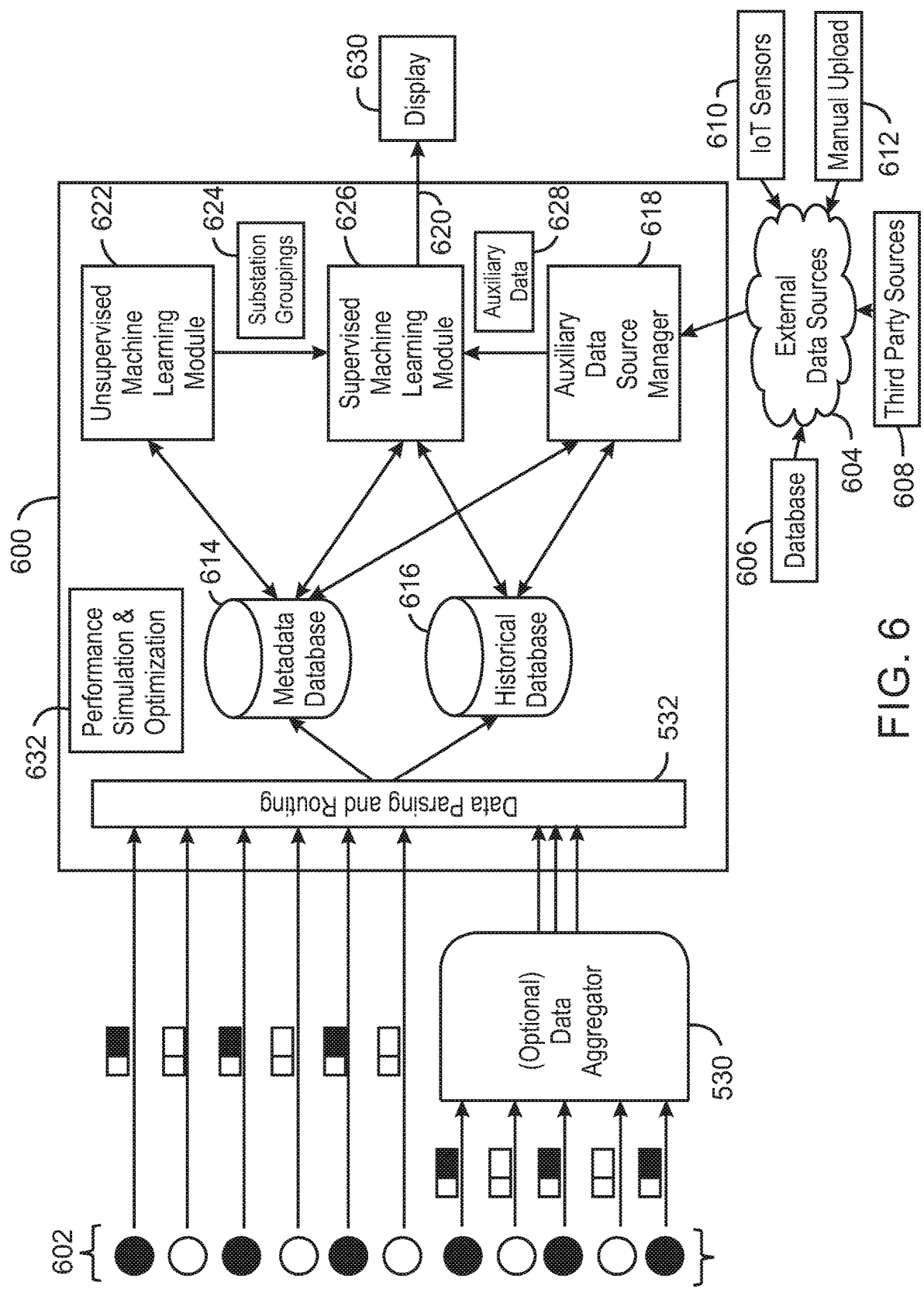
FIG. 6 is a block diagram of a system for prediction of values from, and deployment of, substation monitors.

FIG. 6 is a block diagram of a system 600 for prediction of values from, and deployment of, substation monitors. As described with respect to FIG. 5A, the metadata for the noninstrumented substations (shown as open circles) may not actually come from the substation itself, but from utility systems or auxiliary databases. Metadata for instrumented substations (shown as filled circles) may be provided by the instrumentation, or sourced from the database. However, it is represented as coming from the device here to clarify which device the data refers to. The system 600 may be located in a server 524 in a cloud 502, as described in FIG. 5A, or in a data aggregator 530 or other device, located in a fog 528 device, as described with respect to FIG. 5B.

The system 600 can perform the methods described with respect to FIGS. 8-11 and 13-16. The methods may be performed upon reception of new, or significantly changed, data. Further, the methods may be repeated on a periodic basis, or triggered by an external user. The reception of new data can occur in a variety of ways. For example, data may be polled by the system 600 from substations 602, or external data sources 604, such as utility databases 606, third-party data sources 608, or IoT sensors 610. Further, data may be pushed into the system by external data sources 604 or directly by a substation 602. Data may also be manually uploaded 612 to the system 600, for example, by a grid stakeholder. The data may be saved in local stores within the system 600, for example, in a metadata database 614 and a historical database 616. An auxiliary data source manager 618 may control the intake of data from the external data sources 604, among other functions.

The components of this system 600 interact with each other to produce forecasts 620 for both instrumented and noninstrumented substations alike. Forecasts 620 for noninstrumented substations use an unsupervised machine learning module (UMLM) 622 to produce substation groupings 624 to deduce which instrumented substations to use on aggregate to generate models. In contrast, forecast 620 for instrumented substations generally do not need the UMLM 622, because a model can be generated directly from the data available for that substation.

The main components of the system 600 include a data aggregator 530. This component may or may not exist in a particular deployment. The data aggregator 530 may retrieve and aggregate data from several substations 602, and then provide the relevant data to the system 600. The data aggregator 530 may also provide metadata for several noninstrumented substations to the system 600. Further, in some examples, as described with respect to FIG. 5B, the data aggregator 530 may also include the entire system 600. If the data aggregator 530 is not present in a given deployment, instrumented substation data may arrive directly from the instrumented substations.

A data parsing and routing component (DPR) 532 receives data from external systems, such as instrumented substations and the data aggregator 530. The DPR 532 may be programmed to parse the data and insert the relevant metadata into the metadata database 614 and historical data into the historical database 616.

The metadata database 614 stores the substation metadata. As described herein, the metadata changes infrequently or never, such as substation ratings, instrumentation characteristics, substation geographical coordinates, and the like. The metadata is available for all substations which need to be forecasted, both instrumented and noninstrumented.

The historic substation data is stored in the historical database 616. In contrast to the metadata, the historical data changes as a function of time. The historic substation data stored in the historical database may include active power, reactive power, voltage, and the like for forecasting performance of a substation. The historic data is generally only available in sufficient quantities for instrumented substations. Further, the historic data may include data used to monitor grid performance and substation dynamics. For example, these may include true or active power (P), apparent power (S), reactive power (Q), voltage-ampere reactive (VAR), and the like.

As used herein, active power (P) is measured in units of watts (W), and is calculated as $I^2R$ or IE, where I is amperage (amps), R is resistance (ohms), and E is voltage (volts). Reactive power (Q) is a measure of the power draw from the reactance of the inductive and capacitive loads, and is calculated as $I^2X$ or $E^2/X$, where X is a function of the circuit's reactance. Apparent power (S) is a measure of the power draw from the impedance of the circuits, and is calculated as $I^2Z$ or $E^2/Z$, where Z is a function of the circuit's impedance. VAR is an abbreviation of, and is measures the temporary draws from inductive loads.

Some of these measurements have acute consequences and some more chronic consequences. For example, when these operational parameters are exceeded, equipment may fail and substations may go off line. Accordingly, the forecasts for the noninstrumented stations may use this information to forecast potential equipment failures in the noninstrumented stations.

The UMLM 622 may retrieve metadata from the metadata database 614 and execute an unsupervised learning (clustering) algorithm, as described herein. It then passes relevant results, such the substation groupings 624, to the supervised machine learning module (SMLM) 626. The UMLM 622 may also store the result and other relevant metadata back into the metadata database 614.

The SMLM 626 receives data from the UMLM 622, the metadata database 614, the historical database 616, and the auxiliary data source manager 618 and executes the supervised learning (forecasting) algorithms described below. It then stores the forecasts and the relevant data in the metadata database 614 and the historical database 616 and makes the forecasts 620 available to external agents, for example, for presentation on a display 630 at an operator workstation.

As described herein, the auxiliary data source manager 618 retrieves auxiliary data 628 from external data sources 604, either down-sampling or interpolating the auxiliary data 628, storing the auxiliary data 628 and presenting the auxiliary data 628 to the SMLM 626. As described, external data sources can include, but are not limited to, weather data across diverse geographic regions, utilities' operations databases, utilities' predictive maintenance databases, utilities' geographical information services (GIS) database, social media websites, traffic forecasting services, and the like. The auxiliary data source manager 618 may also provide data source discovery, quality assessment and caching.

The system 600 may also include a performance simulation and optimization subsystem 632 to run simulations using the existing databases and the available supervised and unsupervised learning modules. Although the system 600 is shown in relation to the previous sparse instrumentation forecasting invention, the performance simulation and optimization subsystem 632 can be deployed on any smart grid or IoT forecasting system that can forecast in the presence of sparse instrumentation.

The performance simulation and optimization subsystem 632 may iteratively run simulations of the forecasting performance for a given grid configuration, including different combinations of instrumented and noninstrumented substations. This may be performed by triggering the UMLM 622 and SMLM 626 with simulated data, such as modified instances of data from the existing databases, and capturing the simulated forecasts before they are emitted to external systems. The simulated forecasts are then fed back into the performance simulation and optimization subsystem 632 to allow a comparison with the available historical data to evaluate the forecasting performance for a current simulated configuration of the grid.

Generally, the performance simulation and optimization subsystem 632 accesses the metadata database 614 and the historical database 616. For each budget level, a binary optimization feature vector may be created, in which each element represents a substation and the value of the vector describes whether or not the corresponding substation is instrumented in the simulation. Unsupervised optimization may be run, which iteratively changes which elements of the feature vector are high, which, in turn, changes which substations are instrumented in the simulation. At each iteration, a simulated forecast is generated for the sparsely instrumented substations. For each substation the simulated forecasts are compared with the available historical data to evaluate the average forecast error across all substations, both instrumented and simulated noninstrumented. The binary feature vector is iterated according to the chosen optimization algorithm's process. At every iteration of the optimization algorithm the current un-optimized performance-cost pair is stored. At every optimization termination the optimized performance-cost pair is stored. When the performance simulation finishes, models and graphs are constructed to enable planning of deployment costs and optimal deployment strategies.

Figure 7:
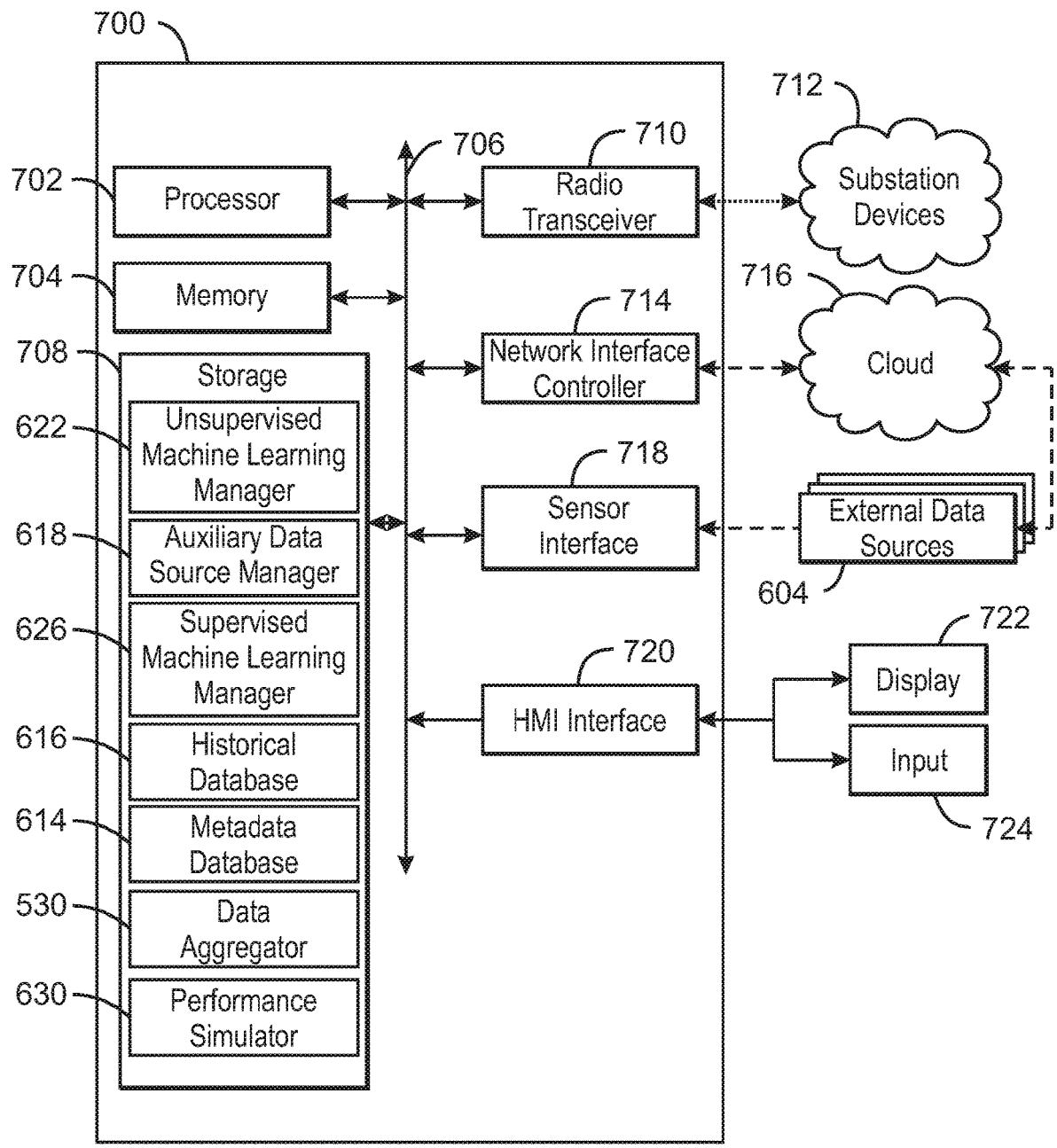
FIG. 7 is a block diagram of an example of components that may be present in a system for forecasting from data received from sparsely instrumented.

FIG. 7 is a block diagram of an example of components that may be present in a system 700 for forecasting from data received from sparsely instrumented substations. The system may include any combinations of the components shown in the example, and may be a separate server in a cloud or may be part of a fog device. The components may be implemented as ICs, portions thereof, discrete electronic devices, or other modules, logic, hardware, software, firmware, or a combination thereof adapted in the system, or as components otherwise incorporated within a chassis of a larger system. The block diagram of FIG. 7 is intended to show a high level view of components of the system 700. However, some of the components shown may be omitted, additional components may be present, and different arrangement of the components shown may occur in other implementations.

The system 700 may include a processor 702, which may be a microprocessor, a multi-core processor, a multithreaded processor, an ultra-low voltage processor, an embedded processor, or other known processing element. The processor 702 may be a part of a system on a chip (SoC) in which the processor 702 and other components are formed into a single integrated circuit, or a single package, such as the Edison™ or Galileo™ SoC boards from Intel. As an example, the processor 702 may include an Intel® Architecture Core™ based processor, such as a Quark™, an Atom™, an i3, an i5, an i7, or an MCU-class processor, or another such processor available from Intel® Corporation, Santa Clara, Calif. However, other processors may be used, such as available from Advanced Micro Devices, Inc. (AMD) of Sunnyvale, Calif., a MIPS-based design from MIPS Technologies, Inc. of Sunnyvale, Calif., an ARM-based design licensed from ARM Holdings, Ltd. or customer thereof, or their licensees or adopters. The processors may include units such as an A5, A9, or similar, processor from Apple® Inc., a Snapdragon™ processor from Qualcomm® Technologies, Inc., or an OMAP™ processor from Texas Instruments, Inc.

The processor 702 may communicate with a system memory 704 over a bus 706. Any number of memory devices may be used to provide for a given amount of system memory. As examples, the memory can be random access memory (RAM) in accordance with a Joint Electron Devices Engineering Council (JEDEC) low power double data rate (LPDDR)-based design such as the current LPDDR2 standard according to JEDEC JESD 209-2E (published April 2009), or a next generation LPDDR standard to be referred to as LPDDR3 or LPDDR4 that will offer extensions to LPDDR2 to increase bandwidth. In various implementations the individual memory devices may be of any number of different package types such as single die package (SDP), dual die package (DDP) or quad die package (Q17P). These devices, in some embodiments, may be directly soldered onto a motherboard to provide a lower profile solution, while in other embodiments the devices are configured as one or more memory modules that in turn couple to the motherboard by a given connector. Any number of other memory implementations may be used, such as other types of memory modules, e.g., dual inline memory modules (DIMMs) of different varieties including but not limited to microDIMMs or MiniDIMMs. For example, a memory may be sized between 2 GB and 16 GB, and may be configured as a DDR3LM package or an LPDDR2 or LPDDR3 memory, which is soldered onto a motherboard via a ball grid array (BGA).

To provide for persistent storage of information such as data, applications, operating systems and so forth, a mass storage 708 may also couple to the processor 702 via the bus 706. The mass storage 708 may be implemented via a solid state disk drive (SSDD), a hard drive, an array of hard drives, and the like. However, in some examples, the mass storage 708 may be implemented using a micro hard disk drive (HDD), such as in IoT devices. Further, any number of new technologies may be used for the mass storage 708 in addition to, or instead of, the technologies described, such resistance change memories, phase change memories, holographic memories, or chemical memories, among others. For example, the system 700 may incorporate the 3D XPOINT memories from Intel® and Micron®.

The components may communicate over the bus 706. The bus 706 may include any number of technologies, including industry standard architecture (ISA), extended ISA (EISA), peripheral component interconnect (PCI), peripheral component interconnect extended (PCIx), PCI express (PCIe), or any number of other technologies. The bus 706 may be a proprietary bus, for example, used in a SoC based system. Other bus systems may be included, such as an I$^2$C interface, an SPI interface, and point to point interfaces, among others.

The bus 706 may couple the processor 702 to a radio transceiver 710, for communications with substations 712. The radio transceiver 710 may include any number of frequencies and protocols, such as a WLAN unit used to implement Wi-Fi™ communications in accordance with the Institute of Electrical and Electronics Engineers (IEEE) 802.11 standard. In addition, wireless wide area communications, e.g., according to a cellular or other wireless wide area protocol, may be implemented via a WWAN unit. For examples in which the system 700 is an IoT device, the radio transceiver 710 may include a radio for communications at about 2.4 gigahertz (Ghz) under the IEEE 802.15.4 standard, for example, using the Bluetooth® low energy (BTLE) standard, as defined by the Bluetooth® Special Interest Group, or the ZigBee® standard, among others. Any number of other radios, configured for a particular wireless communication protocol, may be included in the radio transceiver 710.

The radio transceiver 710 may include a low power wide area (LPWA) transceiver 713 to communicate with substations 712 over an LPWA link. In this example, the communications may follow the IEEE 802.15.4 and IEEE 802.15.4g standards, among others. For example, the system 700 may communicate over a wide area using LoRaWAN™ (Long Range Wide Area Network) developed by Semtech and the LoRa Alliance. The techniques described herein are not limited to these technologies, but may be used with any number of other cloud transceivers that implement long range, low bandwidth communications, such as Sigfox, and other technologies.

The bus 706 may couple the processor 702 to a network interface controller (NIC) 714 that may couple to a cloud 716 over a wired connection. The cloud 716 may also connect to external data sources 604, such as databases, external IoT devices, and the like, as described with respect to FIG. 6. The bus 706 may couple the processor 702 to a sensor interface 718. The sensor interface 718 may be used to obtain sensor readings from the external data source 604.

A human-machine interface (HMI) 720 may be included to couple the system 700 to various input/output (I/O). For example, a display 722 may be included to show information, such as forecasts or deployment plans. An input device 724, such as a keyboard or touch screen or keypad may be included to accept input for directing the operations.

The mass storage 708 may include a number of modules to implement the forecasting and deployment prediction functions described herein. These modules are as described with respect to FIG. 6.

In examples in which the system 700 is an IoT device, for example, in a fog device, a number of other units may be included. For example, a battery may power the system 700. The battery may be a lithium ion battery, a metal-air battery, such as a zinc-air battery, an aluminum-air battery, a lithium-air battery, and the like. A battery monitor/charger may be included in the system 700 to track the state of charge (SoCh) of the battery. The battery monitor/charger may be used to monitor other parameters of the battery to provide failure predictions, such as the state of health (SoH) and the state of function (SoF) of the battery. The battery monitor/charger may include a battery monitoring integrated circuit, such as an LTC4020 or an LTC2990 from Linear Technologies, an ADT7488A from ON Semiconductor of Phoenix Ariz., or an IC from the UCD90xxx family from Texas Instruments of Dallas, Tex. The battery monitor/charger may communicate the information on the battery to the processor 702 over the bus 706. The battery monitor/charger may also include an analog-to-digital (ADC) convertor that allows the processor 702 to directly monitor the voltage of the battery, or, with appropriate circuitry, the current flow from the battery.

A power block, or other power supply coupled to a grid, may be coupled with the battery monitor/charger to charge the battery. In some examples, the power block may be replaced with a wireless power receiver to obtain the power wirelessly, for example, through a loop antenna in the system 700. A battery charging circuit, such as an LTC4020 chip from Linear Technologies of Milpitas, Calif., among others, may be included in the battery monitor/charger. The specific charging circuits chosen depend on the size of the battery, and thus, the current required. The charging may be performed using the Airfuel standard promulgated by the Airfuel Alliance, the Qi wireless charging standard promulgated by the Wireless Power Consortium, the Rezence charging standard, promulgated by the Alliance for Wireless Power, among others.

Figure 8:
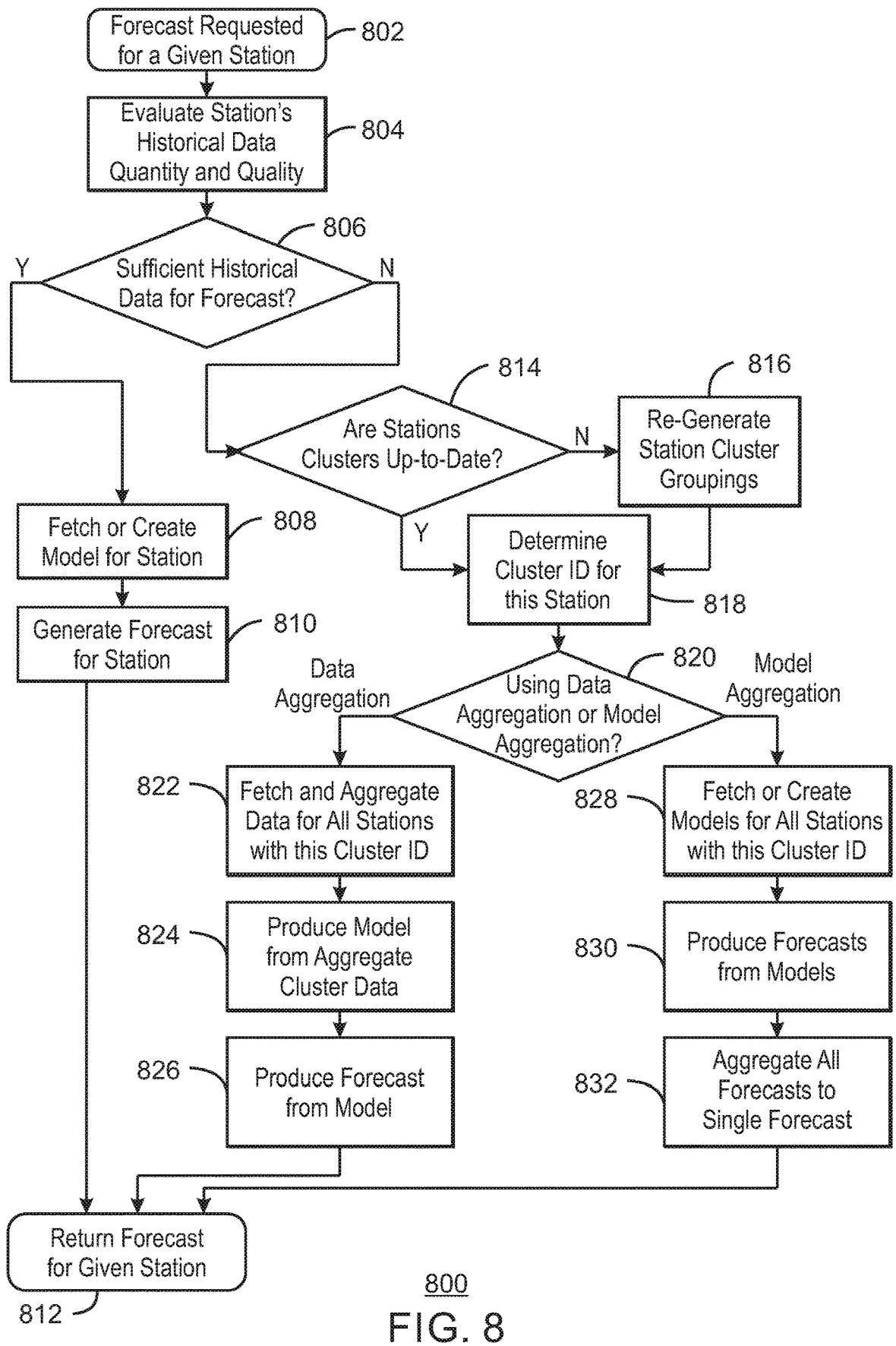
FIG. 8 is a process flow diagram of a method for forecasting values for a particular substation.

FIG. 8 is a process flow diagram of a method 800 for forecasting values for a particular substation. The method 800 may be implemented by the system described with respect to FIGS. 6 and 7. The method 800 starts at block 802 when a forecast for a given substation is requested.

At block 804, the quantity and quality of a substation's historical data is requested. This determines whether forecasts can be provided for either an instrumented or a noninstrumented substation. The data is evaluated at block 806 to determine if the data quality or quantity is sufficiently high, for example above an empirically defined threshold. If so, the substation is deemed to be an instrumented substation and process flow proceeds to block 808. At block 808, a model generated from the substation's available data is accessed or created. At block 810, the forecast for the substation is generated. At block 812, the forecast for the substation is returned.

If data of insufficient quality or quantity to generate a forecast, process flow proceeds to block 814. At block 814, a determination is made as to whether substation clusters are up-to-date, either from the age of the previous cluster operation or if the metadata used for the previously executed operation has significantly changed since the past clustering operation. If not, at block 816 the substation clusters are regenerated, for example, using the unsupervised machine learning module described with respect to FIG. 6. At block 818, the cluster identification for the substation to be forecast is determined. This identifies the substations that have similar metadata, and are likely to have similar parameters.

At block 820, a determination is made as to whether the forecasting should use data aggregation or model aggregation. The determination is made by evaluating against a flag set by the system user. If by data aggregation, process flow proceeds to block 822.

At block 822 the data for all substations with the same cluster id as the requested substation are fetched, and the data is aggregated, for example, by the weighted or unweighted averaging of the data across samples with the same or similar timestamps. At block 824, a model may be produced from the aggregated cluster data. At block 826, a forecast is produced from the model. process flow then proceeds to block 812 to return the forecast.

If, at block 820, it is determined that the user has selected a model aggregation, process flow proceeds to block 828. At block 828, models are fetched or created for all substations with the same cluster ID as the requested substation. At block 830, forecasts are generated from each of the models for the requested substation. At block 832, all of the forecasts are aggregated to generate a single forecast, for example, by averaging together the forecasts over time or by using more sophisticated machine learning ensemble technique. Process flow then returns to block 812 to present the forecast for the requested substation.

The method 800 uses a number of algorithms to generate the forecasts for the requested substation. Two machine learning techniques, unsupervised learning and supervised learning, are used to produce online forecasts of noninstrumented substations. A third technique, concurrent feature selection, is used to dynamically update the optimal set of data sources employed for both the unsupervised and supervised learning phase to maximize predictive performance.

Figure 9:
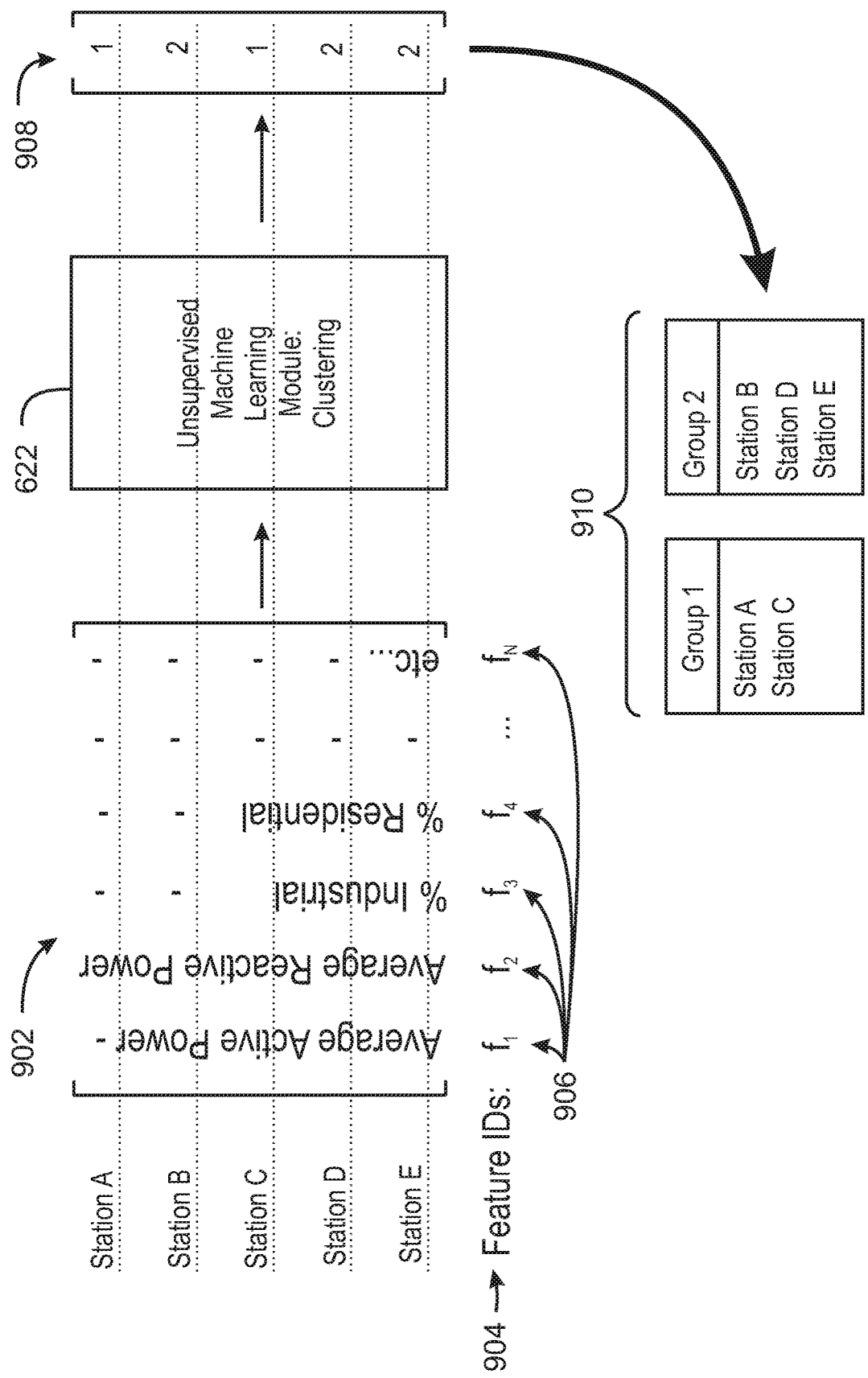
FIG. 9 is a schematic diagram of the unsupervised learning operations. The unsupervised learning operations are executed on the unsupervised machine learning module described with respect to FIG. 6.

FIG. 9 is a schematic diagram of the unsupervised learning operations. The unsupervised learning operations are executed on the unsupervised machine learning module 622 described with respect to FIG. 6. The unsupervised learning technique that may be utilized is clustering. Any clustering technique can be employed, for example, hierarchical clustering, Expectation-Maximization (EM), k-means, density-based spatial clustering of applications with noise (DB-SCAN).

The clustering feature matrix 902 contains all features deemed relevant to this particular clustering operation. The binary feature selection vector 904, [f1, f2, . . . , fN], may be calculated by a feature selection algorithm. This dictates whether a particular feature vector will be included in a particular execution of the clustering algorithm. For example, the substation's name would be a bad feature to include as it has little correlation with the substation's power profile over time, but the substation's average expected power consumption from utility planning data would be a good feature for grouping substations. Other possible features for grouping include average power, repetitiveness (e.g., average intra-day correlation), the relation of the substation to all others in hierarchy, area load classifications (e.g., 20% residential, 50% industrial, 30% commercial), regional energy tariffs of customers, and the like.

The clustering feature matrix 902 is provided to the UMLM for clustering. In an example, this was performed by a k-means clustering algorithm. By applying the clustering technique to the set 904 of data features 906 derived from the substation's metadata, a list of cluster labels 908 may be generated for each substation. The list of cluster labels 908 may then be used to generate substation groupings 910 that include all of the similar substations, each with a unique cluster id. These groupings state which substations should be grouped by similarity for the supervised learning phase. These groupings are employed when a forecast for a noninstrumented substation is requested.

To enable forecast model generation, it is necessary to have at least one instrumented substation in each cluster. Clustering techniques do not natively include mechanisms to ensure this, hence, this can be achieved with various additional algorithmic steps. For example, a cluster without an instrumented station may be merged into the closest cluster which does contain an instrumented station. Further, an instrumented station closest to the cluster which does not have instrumented stations may be merged into that cluster, or the like.

Figure 10:
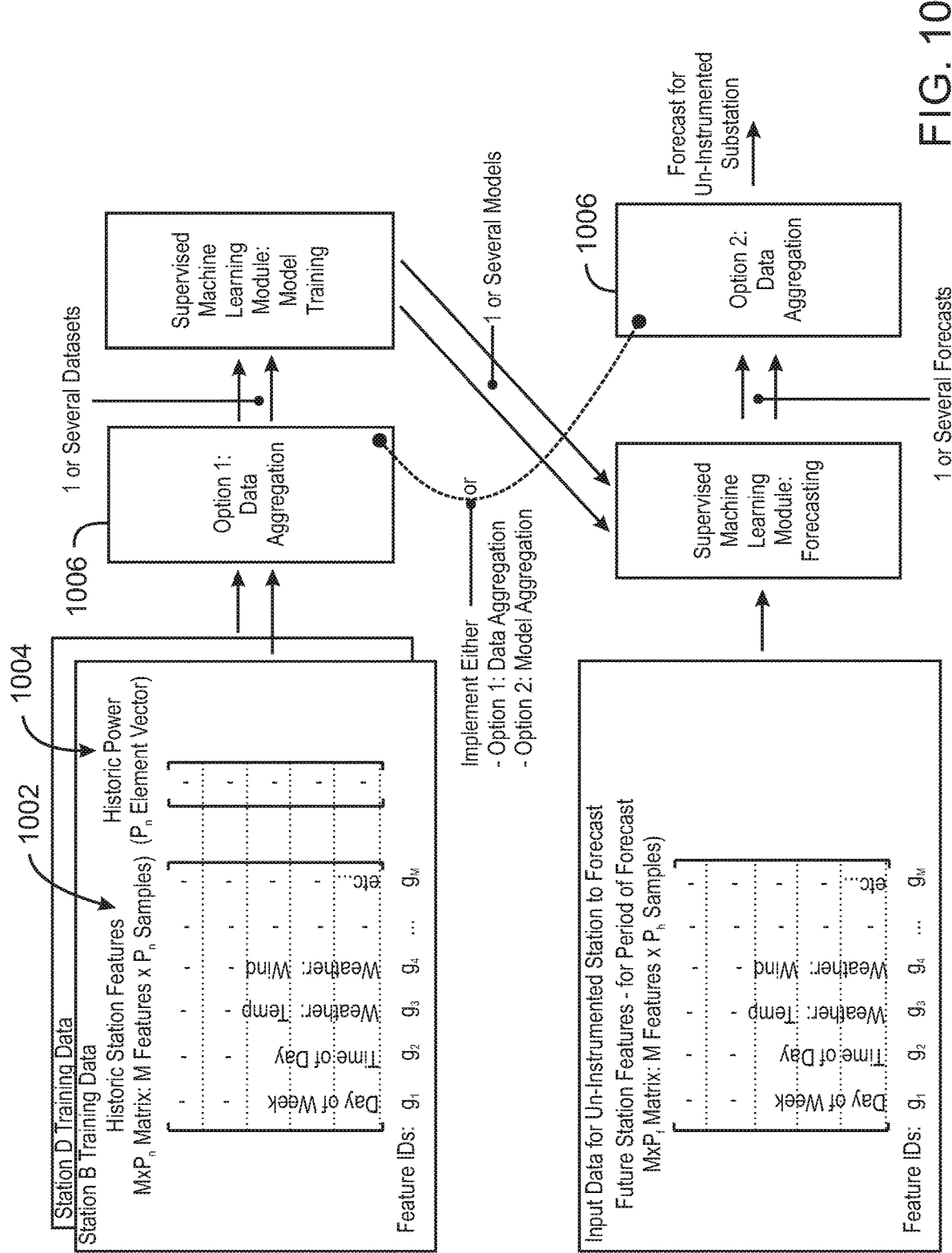
FIG. 10 is a schematic diagram of the supervised learning operations. The supervised learning operations are executed on the supervised machine learning module described with respect to FIG. 6.

FIG. 10 is a schematic diagram of the supervised learning operations. The supervised learning operations are executed on the supervised machine learning module 626 described with respect to FIG. 6. In one example, the particular supervised machine learning techniques employed was regression. The regression techniques may be used to build models on continuous-value labelled data to infer labels for future unlabeled data. Any number of regression techniques may be used to infer labels in this invention, including linear regression, polynomial regression, artificial neural networks, support vector machines, Gaussian processes, random forests, decision trees, and the like.

The supervised learning operations assume that a set of substation groupings have already been determined by the unsupervised learning operations, described with respect to FIG. 9. In this example, a forecast for substation 114 (FIG. 1) has been requested, and it has been found that instrumented substations 108 and 112 are most similar to the noninstrumented substation 114. In this context we will call the substations on which the model is based on, substations 108 and 112 the source substations. For each source substation, there is a feature matrix containing the input or independent features of the model, termed historic substation features 1002, and an output or dependent feature vector, termed the historic power features 1004. The generated regression model maps the translation between the historic substation features 1002 and the historic power features 1004.

The historic substation features 1002 initially contains all available historic data sources. However not all sources are beneficial to the predictive performance of the model. As described herein, the binary feature selection vector [g1, g2, . . . , gN] may be calculated by the techniques feature selection algorithm, which dictates whether a particular feature vector will be included in a particular execution of the regression algorithm.

One factor in the generation of a forecast for one substation from data from a number of substations is the chosen aggregation strategy 1006. To generate a single substation's forecast, either the data from all substations must be aggregated together into a single dataset before model generation, or multiple forecasts, one per substation, must be aggregated after forecasting from the models occurs. Aggregation is performed by either data aggregation or model aggregation based on a flag set beforehand as described with respect to FIG. 8. The two techniques are equally valid and which one to use is dependent on the use-case and the user's secondary requirements. For example, using the data aggregation technique may also produce prediction intervals, which is an estimate of the confidence bounds of the forecasted load over time, which is of interest to many grid planners.

Model aggregation, on the other hand, does not readily produce forecast prediction intervals because it aggregates the forecasted values, and prediction intervals should not be aggregated across model outputs. However, model aggregation is more efficient as it can reuse the models which may already have been generated for individual substations, whereas data aggregation requires the production of a new model for each combination of substations to aggregate.

Examples of candidate independent features are shown FIG. 10. However, this list is not complete as any set of time-varying features that may be derived from the vicinity of the substation can be used. The feature section algorithm described with respect to FIG. 11, may establish which features are the most relevant to maximizing forecasting performance.

Figure 11:
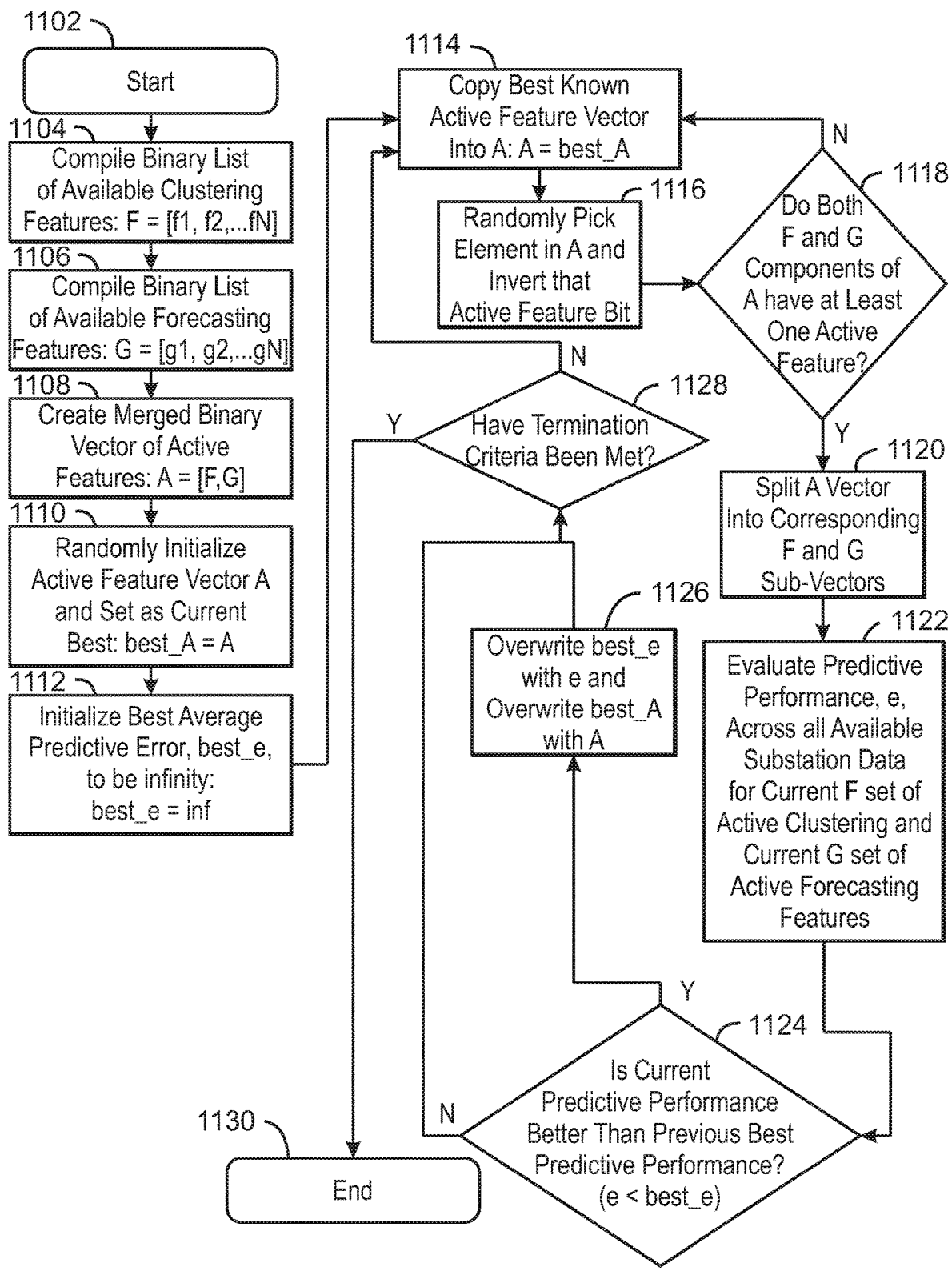
FIG. 11 is a process flow diagram of a method for concurrent feature selection.

FIG. 11 is a process flow diagram of a method 1100 for concurrent feature selection. The method 1100 deduces the optimal combination of clustering features (F) and regression features (G) from all available features. As described herein, any number of auxiliary features may be included in the clustering, for example, of static features, and the forecasting, for example, of time-varying features. The clustering algorithm and the feature selection algorithm will automatically establish which features are relevant to maximize noninstrumented substation forecasting performance. Feature selection is a standard approach to rigorously deducing which subset from a set of candidate features are most appropriate for a given unsupervised or supervised learning model. Feature selection usually occurs for a single model at a time as the features are chosen for the regression model to maximize its performance. However, the technique described herein perform feature selection for two cascaded models concurrently.

The method 1100 starts at block 1102. At block 1104, a binary list of available clustering features (F) is compiled. Such clustering features may include the substation's average expected power consumption from utility planning data, average power, repetitiveness (e.g., average intra-day correlation), the relation of the substation to all others in hierarchy, area load classifications (e.g., 20% residential, 50% industrial, 30% commercial), regional energy tariffs of customers, and the like. At block 1106, a binary list of available forecasting features (G) is compiled. Examples of such features are shown in FIG. 10 as the historic substation features 1002.

At block 1108, a merged binary vector of the active features (A) is created. In the binary vector A, each binary element represents whether the corresponding feature is used in the models. On each evaluation the A vector is split into its constituent F and G components, then the F and G binary vectors are applied to the clustering and regression models respectively and the predictive performance is evaluated.

At block 1110, the values of the active feature vector A are randomly initialized. The initialized vector is then set as the current best value, for example, best_A=A. At block 1112, the best average predictive error is initialized to be infinity (inf), for example, indeterminately large. At block 1114, the current best feature vector (best_A) is copied into the active feature vector (A). At block 1116, an element in A is randomly picked, and the active feature bit for that feature is inverted. This classifies the feature as not being important to the prediction, for example, being eliminated from the calculations.

At block 1118, a determination is made as to whether F and G components of A have at least one binary-active element each. This is performed to confirm that at least one input feature is present for the clustering or regression models to perform the noninstrumented substation forecasting operation. This may be applied to any machine learning task where a number of machine learning models are cascaded together to achieve a final use-case or application with associated performance characteristics. If not, process flow returns to block 1114, to invert another feature bit, activating that feature for the analysis.

At block 1120, the A vector is divided into the F and G vectors for the evaluation. At block 1122, the predictive performance is evaluated across all available substation data for the current F set for clustering and the current G set for active forecasting features. At block 1124, a determination is made as to whether the current predictive performance is better than the previous predictive performance. If so, at block 1126 the current predictive performance, e, and the current vector, A, are overwritten with the current values for e and A.

At block 1128, a determination is made as to whether the method 1100 should be terminated. The criteria that may be used in the evaluation include, for example, the number of iterations since a decrease in forecasting error or if the error is below a given threshold. Other criteria may include whether a previously unexplored feature set is identified in y iterations. If any or all of these criteria are evaluated to be true, at block 1130, the method 1100 terminates. The best_A vector is stored for future execution of the noninstrumented substation forecasting executions.

The method 1100 may be performed in parallel to the main functions of the noninstrumented substation forecasting. For example, it may be periodically executed in batch mode to perform a simulation that replicates the behavior of the system 600 described with respect to FIG. 6, to determine the optimal set of model features for the system 600. This set of features is then stored and used next time a noninstrumented substation forecast occurs.

Figure 12:
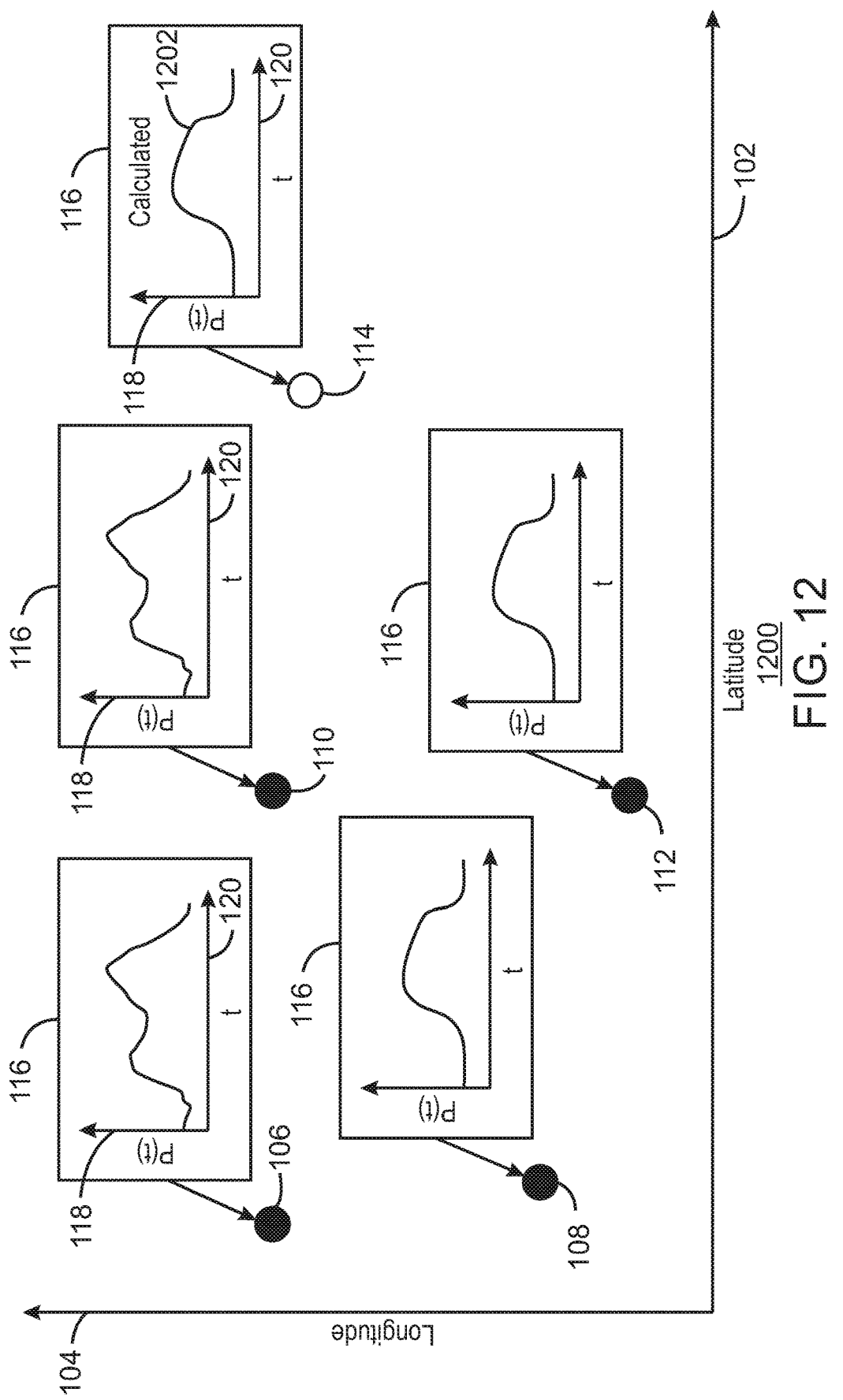
FIG. 12 is the map of FIG. 1, showing the result obtained for forecasting of a noninstrumented substation.

FIG. 12 is the map of FIG. 1, showing the result obtained for forecasting of a noninstrumented substation. The techniques allow estimation of a sensor profile 1202, such as active power, reactive power, voltage, and the like, at a noninstrumented substation, such as substation 114. Grouping substations by similar metadata, for example, using unsupervised machine learning, substantially improves substation forecasting performance over aggregating data or models from all substations. Further, the ability to predict from sparse instrumentation is more economical than instrumenting all substations. This has been shown lead to substantial deployment cost reduction in the field and can enable other deployment cost reduction services for smart grid stakeholders.

Although the techniques described herein are focused on substation forecasting, they may be generalized to any use case that has IoT devices producing historical sensor data across a variety of deployment environments where metadata describing the static characteristics of the deployment environments is available. This allows the production of forecasts for other deployment environments for which we have metadata but do not have IoT devices deployed.

The examples described herein were tested in a real deployment in which substation data is sent to an analytics service as part of a power project. In this test deployment, concurrent feature selection was performed manually. Thus, clustering occurs on the metadata as new data arrives into the platform and models and forecasts are produced for noninstrumented substations. However, the method 1100 for concurrent clustering may be implemented with the forecasting. The determination of which substations should be instrumented in a sparse deployment affects both the total costs and the accuracy of the forecasts.

Figure 13:
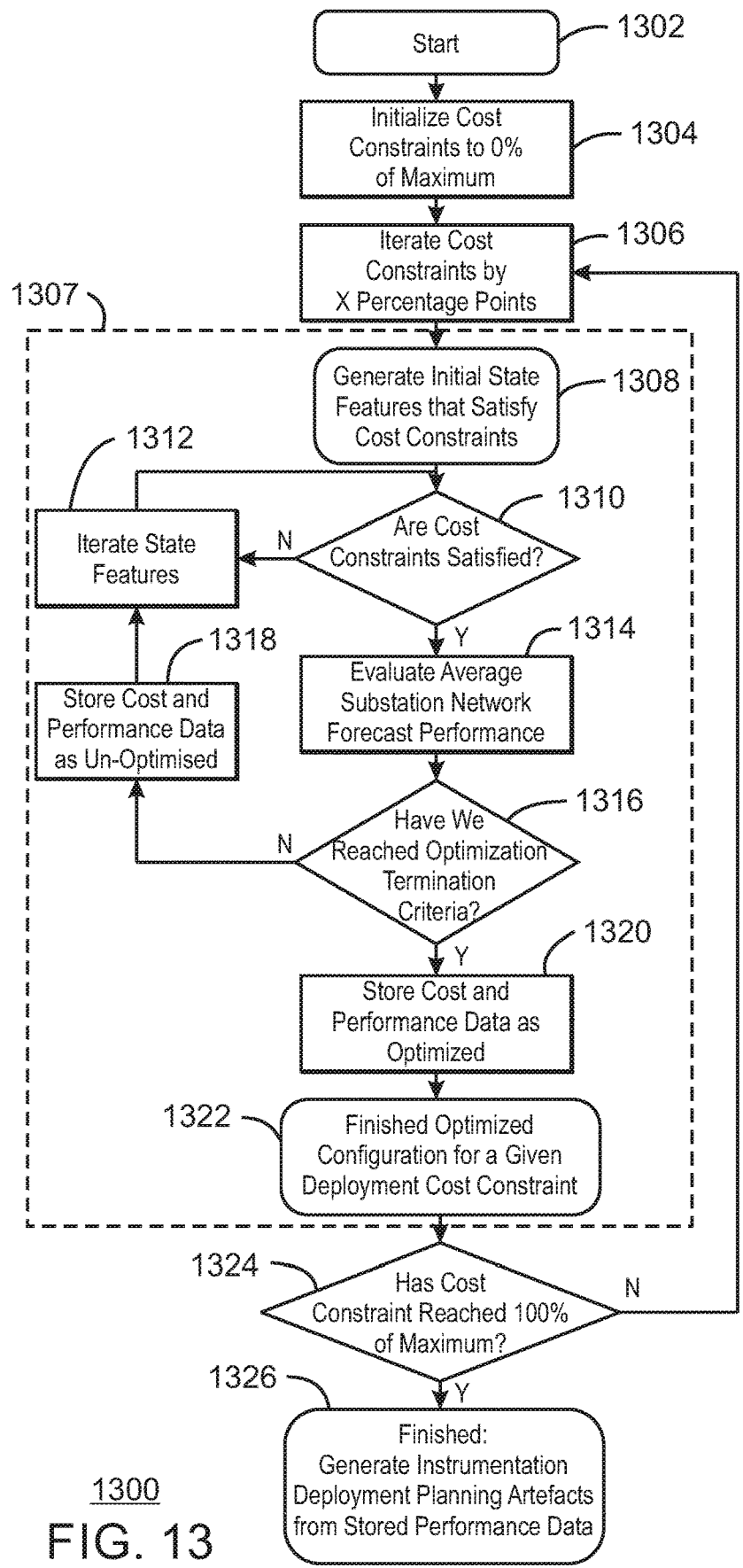
FIG. 13 is a flow chart of a method for optimizing the deployment of instrumentation across substations.

FIG. 13 is a flow chart of a method 1300 for optimizing the deployment of instrumentation across substations. The performance simulation and optimization subsystem 632, described with respect to FIG. 6, may include three components to generate deployment data and models for use by the stakeholder. These components are a performance optimizer, a Pareto frontier generator, and a maximum-likelihood cost model generator.

The performance optimizer generates empirical data for forecasting performance as a function of the subset of substations which are instrumented. For each chosen cost constraint, for example, deployment cost, number of instrumented substations, or percentage of substations which are instrumented, among others, forecasting performance data is acquired for both the optimized grid configuration and for several unoptimized grid configurations for the specific cost constraint. The method 1300 generates the data using the available historical substation data and the available unsupervised and supervised machine learning modules.

The method 1300 begins at block 1302, for example, when a user starts a deployment simulation. At block 1304, the costs constraints are initialized, for example, to 0% of maximum.

At block 1306, the cost is iterated by a predetermined number of percentage points, for example, 1%, 5%, 10%, or more. Block 1306 marks the start of the outer loop. The task of the outer loop is to iteratively provide increasing values of cost constraints for each execution of an inner loop 1307.

At block 1308, a set of initial state features that satisfies the cost constraints is generated. Block 1308 marks the start of the inner loop 1307. The inner loop 1307 takes the cost constraints and iterates towards the highest-performing configuration of the state features that satisfy the currently specified cost constraints. The state features are specified in a binary feature vector in which each element corresponds to a single substation in the grid and the binary value of the element indicates whether that substation is instrumented for that run. A feature vector H may be defined as [substation1, substation2, substation3, . . . , substationN], for example, [1, 0, 1, . . . 1].

Higher instrumentation density and the resulting higher deployment costs, will generally provide higher overall forecasting performance. Accordingly, the inner loop will naturally tend to set as many H elements high as possible without exceeding the specified cost constraint. Hence, the optimization will automatically push the cost of deployment as high as possible without going over the specified cost constraints, so the deployment cost will approach the cost constraint specified by the outer loop by the end of each inner loop. The number of instrumented substations will generally be the same for a specific cost constraint, but the exact subset of substations which are instrumented will iteratively change and lead to higher performance.

At block 1310, a determination is made as to whether cost constraints are satisfied. If not, at block 1312, the state features are iterated, for example, to change the number of instrumentation packages to be deployed to substations, and the cost constraints are recalculated. The input to the evaluation is the feature vector, H, which describes the example grid configuration to evaluate on this iteration. The strategy for iterating the state features controls the progress through the possible configurations of instrumentation in the grid. Any number of meta-heuristic optimization techniques that can support binary features may be used, such as genetic algorithms, simulated annealing, particle swarm optimization, hill climbing, tabu search, and the like. If we encounter a state which exceeds the cost constraints, all optimization techniques have their own strategies to return to a valid state before attempting another iteration. Further, meta-heuristic optimization techniques may be used to evaluate multiple hypotheses on each iteration, allowing high parallelization of this process. For example, particle swarm optimization defines an algorithm in which several hypotheses, referred to as particles, concurrently exist and the cost for each particle is evaluated at the same time. The lowest cost particle historically encountered for a given particle ID is stored and the lowest cost particle across all particles is stored at each iteration. Then the movement of each particle on the next iteration occurs as a function of the lowest cost example of that particle and the lowest cost example of all particles.

At block 1314, the average substation network performance is evaluated. The performance for one substation may be defined as the multiple day-ahead average forecasting percentage error, for several forecasting days throughout the period of data availability. Accordingly, the performance for all substations may be defined as the average of the forecasting performance for each substation, including both instrumented and noninstrumented substations. When a substation is fully instrumented and has sufficient historical data, the forecasts occur using models built on historical data for that substation. When the substation is not instrumented, the forecasts occur using the techniques described herein.

At block 1316, a determination is made as to whether the optimization termination criteria have been reached. At every iteration an evaluation is made as to whether a sufficient number of iterations have been made, or if the iterations should continue. Each meta-heuristic optimization algorithm may have termination criteria that are specific to the algorithm, but general criteria which can be used are no decrease in forecasting error in a predetermined number of iterations, error rates below a given threshold, or encountering a previously unexplored feature set in y iterations, among others.

At block 1318, the cost and performance data for optimized and un-optimized locations is stored. The current [cost, performance] data pairs are stored to enable the generation of instrumentation deployment planning artifacts. This is done for both optimized configurations and for every un-optimized configuration of the grid. Although intermediate states evaluated before the optimal has been found during a meta-heuristic optimization process are generally not useful, it has been noted that these values correspond to evaluations of sub-optimal configurations of the grid, which is useful for the next modelling steps. The data is used to build extra models to inform the customer about the average-case performance they can expect from a deployment without optimizing the deployment strategy. Process flow then returns to block 1312 to repeat the iteration.

At block 1320, the optimized cost and performance are stored. At block 1322, the optimization for a given deployment cost constraint is finished. At block 1324, a determination is made as to whether the cost constraint has reached 100% of maximum, If not, process flow returns to block 1306 to continue the outer loop. If so, at block 1326, the instrumentation deployment planning artifacts on the deployment are generated from the stored performance data.

Figure 14:
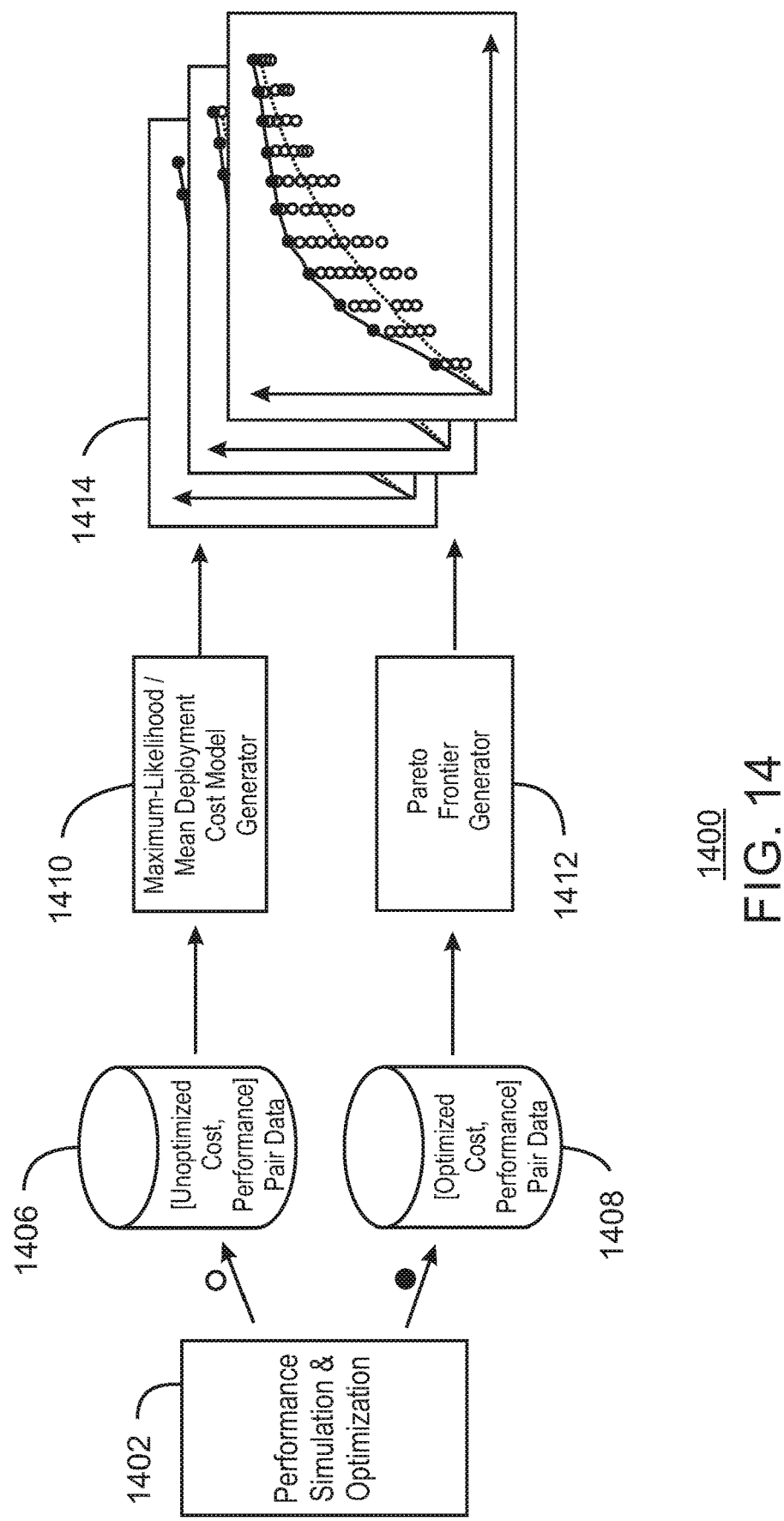
FIG. 14 is a schematic diagram of creating instrumentation deployment planning artifacts from the stored performance data.

FIG. 14 is a schematic diagram 1400 of creating instrumentation deployment planning artifacts from the stored performance data. When the performance simulation and optimization 1402 (method 1300 described with respect to FIG. 13) has completed, the next step is to generate models for optimal performance and average-case un-optimized performance for chosen cost deployment budgets. If we did not have the optimized pairs, standard algorithms could be used to determine the Pareto frontier from all the available un-optimized [cost, performance] data 1406. However, the optimized [cost, performance] pairs 1408 were stored for each cost constraint making this unnecessary.

From the un-optimized [cost, performance] data 1406, the maximum-likelihood cost model 1410 is estimated. The maximum-likelihood cost model 1410 represents the relationship between the deployment cost and the achievable performance, if no optimization of the deployment occurred. This relationship is non-linear, hence is modelled with a non-linear regression model, such as polynomial regression.

From the optimized [cost, performance] pairs 1408, the Pareto frontier may be defined 1412 along the line of these optimal values. The system and algorithms described thus far produces data representing the un-optimized and optimized forecasting performance 1414 for all instrumented and un-instrumented substations at various levels of instrumented substation penetration, hence deployment cost.

Figure 15:
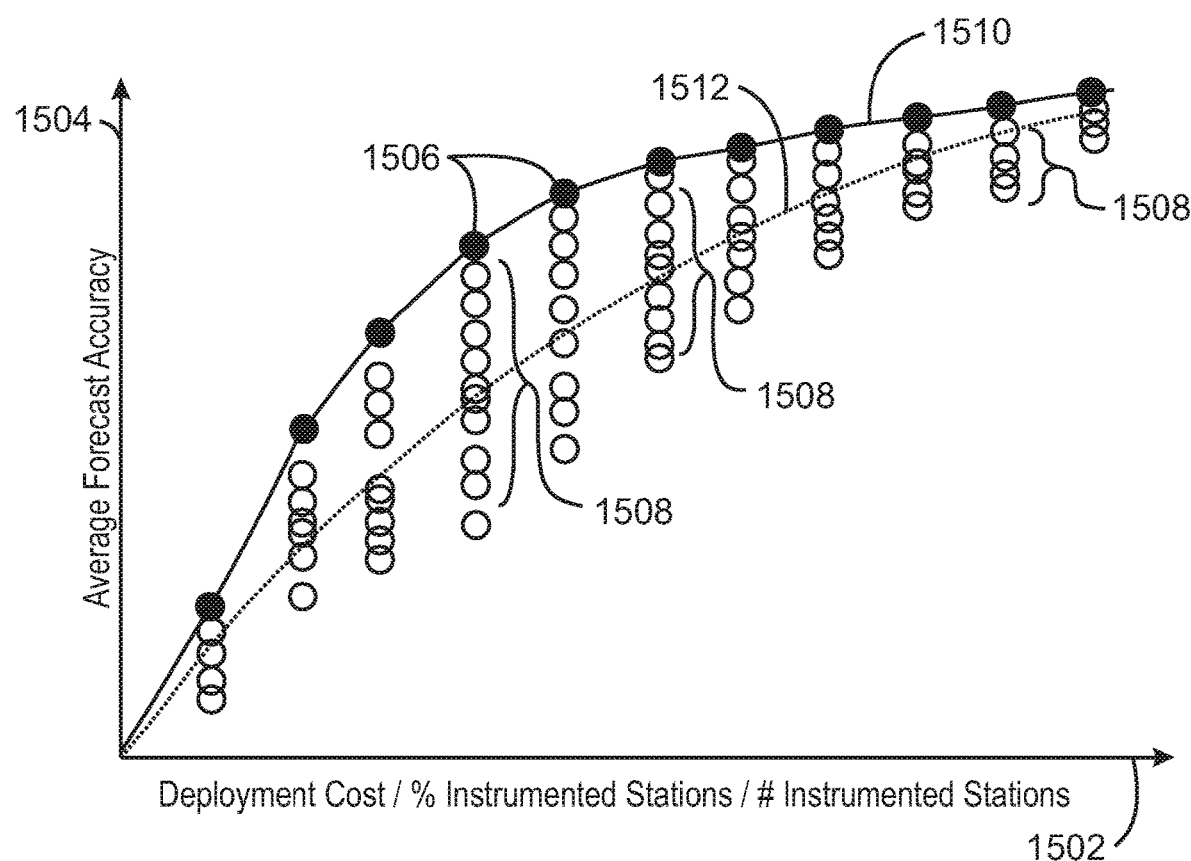
FIG. 15 is a plot of the deployment cost versus the average forecast accuracy, showing the relationship between the optimized grid configuration and the unoptimized grid configurations at a range of cost levels.

FIG. 15 is a plot 1500 of the deployment cost 1502 versus the average forecast accuracy 1504, showing the relationship between the optimized grid configuration 1506 and the unoptimized grid configurations 1508 at a range of cost levels. The corresponding Pareto frontier 1510 and maximum likelihood unoptimized model 1512 are also shown.

From this data, the system can produce the plot 1500. This graph is the tool by which a user deploying a smart grid solution may plan for an investment level and determine the deployment configuration for that investment level that results in optimal performance in the data-based simulation from previous deployments. The user picks a level for the deployment cost 1502 that they are willing to accept. The model is used to estimate associated optimal performance, or average forecasting accuracy 1504, for that cost level. If the user is not satisfied with the level of performance the cost is increased and the model is rerun until an appropriate performance level is reached Once the user is satisfied with the average forecasting accuracy 1504 and the corresponding deployment cost 1502, they may retrieve the associated optimized configuration or state feature. The user may then use the deployment strategy that resulted in that optimized performance as a template for the deployment. The maximum likelihood model represents the average-case performance they can expect if they do not use the optimized deployment strategy. Hence, by using the optimized deployment strategy the user may increase the chances that the performance they can expect will be higher than the maximum likelihood performance for that cost level.

Figure 16:
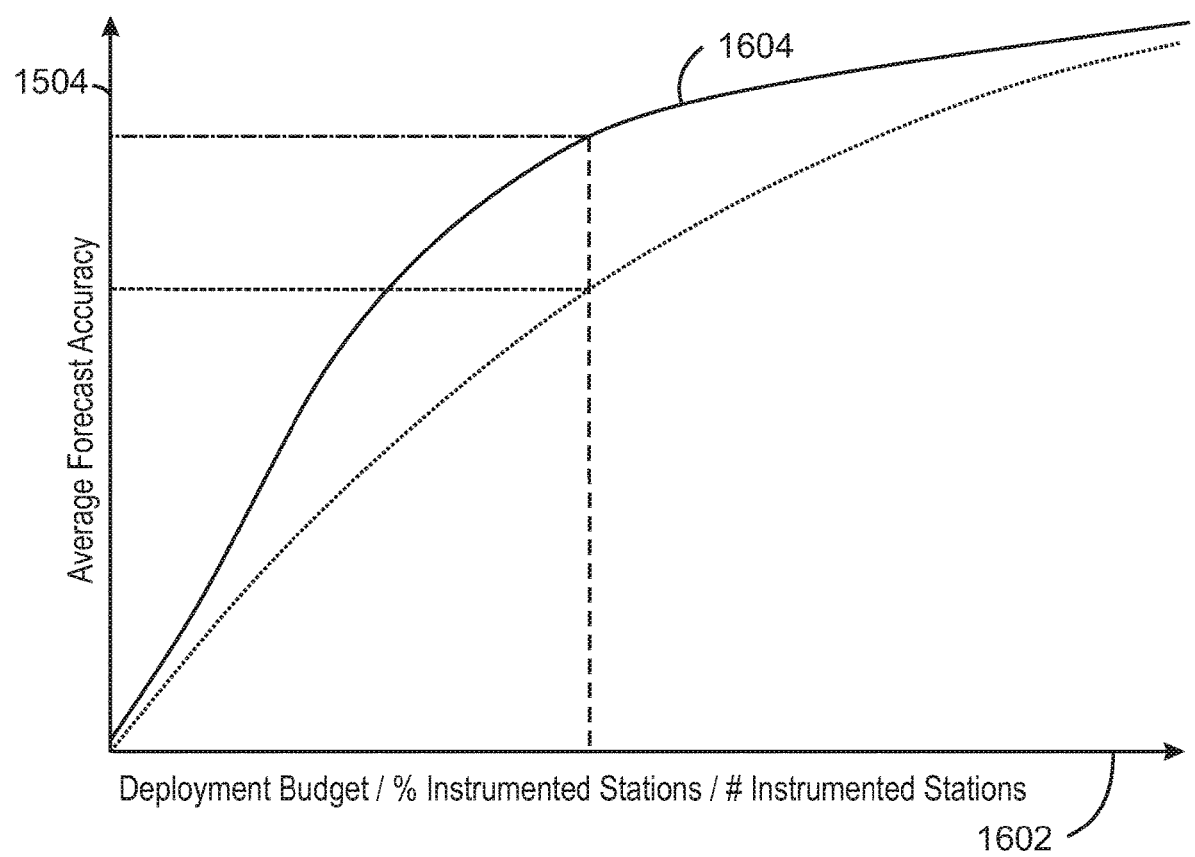
FIG. 16 is a plot that may help a user to decide on a deployment budget.

FIG. 16 is a plot 1600 that may help a user to decide on a deployment budget 1602. For a given chosen budget level, they are also returned the optimized grid configuration that resulted in that optimized performance on the Pareto frontier 1604.

It may be noted that the simulation may be rerun manually or automatically, for example, at regular intervals, to determine if the placement of the instrumentation is optimized, or if it should be changed. This may be useful, for example, if systems expand to more users or more substations. Further, if conditions change, such as increased temperature in a region, the deployment simulation may be rerun to determine if more instrumentation is needed.

Figure 17:
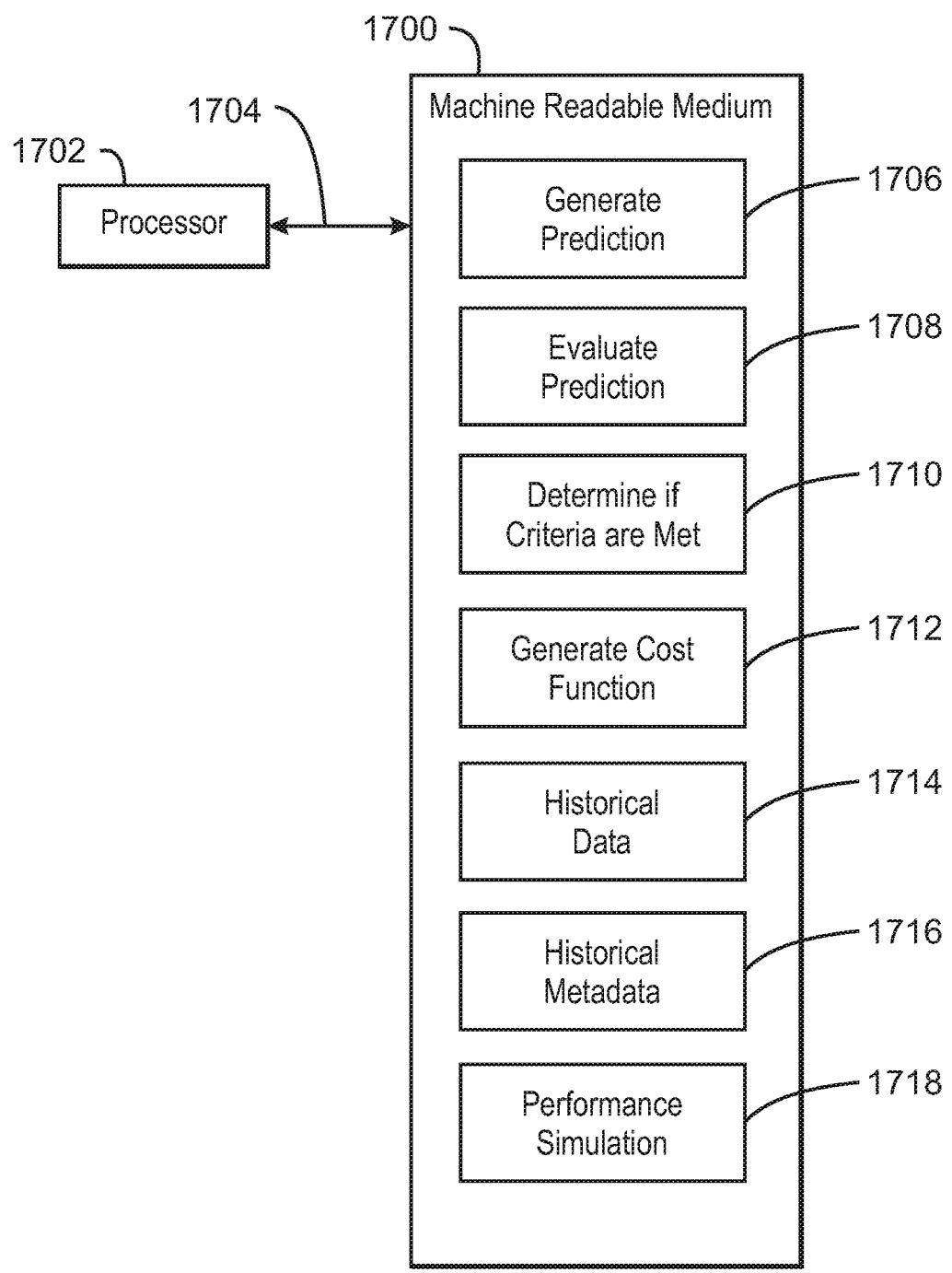
FIG. 17 is a block diagram of a non-transitory, machine readable medium including instructions, which when executed, direct a processor to generate forecasts for noninstrumented substations and to predict forecasting accuracy for particular deployments.

FIG. 17 is a block diagram of a non-transitory, machine readable medium 1700 including instructions, which when executed, direct a processor 1702 to generate forecasts for noninstrumented substations and to predict forecasting accuracy for particular deployments. The processor 1702 may access the non-transitory, machine readable medium 1700 over a bus 1704. The processor 1702 and bus 1704 may be as described with respect to FIG. 7. The non-transitory, machine readable medium 1700 may include devices described for the mass storage 708 of FIG. 7 or may include optical disks, thumb drives, or any number of other hardware devices.

The non-transitory, machine readable medium 1700 may include code 1706 to direct the processor 1702 to generate forecasts for noninstrumented stations, for example, as described with respect to FIGS. 8-11. Code 1708 may be included to direct the processor 1702 to evaluate the prediction, for example, as described with respect to FIG. 8. Code 1710 may be included to direct the processor 1702 to determine if criteria have been met. Code 1712 may be included to direct the processor 1702 to cluster substations, for example, as described with respect to FIG. 11. Code 1714 may be included to direct the processor 1702 to store and retrieve historical data, for example, as described with respect to FIG. 6. Code 1716 may be included to direct the processor 1702 to store and retrieve metadata, for example, as described with respect to FIG. 6. Code 1718 may be included to direct the processor 1702 to run performance simulations to determine an optimum deployment of instrumentation to substations, for example, as described with respect to FIGS. 13-16.

Example 1 includes an apparatus, including a device to forecast performance for a noninstrumented substation. The device has a storage device holds a historic database storing historic data for instrumented substations. The storage device also holds a metadata database of metadata for the instrumented substations and noninstrumented substations. An unsupervised machine learning manager generates a cluster of substations by metadata, wherein at least a portion of the substations in the cluster are noninstrumented substations. A supervised machine learning manager generates a forecast for a noninstrumented substation in the cluster from historic data generated from the instrumented substations.

Example 2 includes the subject matter of example 1. In this example, the device includes a network interface controller (NIC).

Example 3 includes the subject matter of either of examples 1 or 2. In this example, the device includes a radio transceiver.

Example 4 includes the subject matter of any of examples 1 to 3. In this example, the device includes an auxiliary data source manager to retrieve data from an external database in a cloud, an internet-of-things (IoT) device, or a sensor, or any combinations thereof.

Example 5 includes the subject matter of example 4. In this example, the external database includes weather data.

Example 6 includes the subject matter of example 4. In this example, the external database includes metadata for substations.

Example 7 includes the subject matter of example 4. In this example, the external database includes scheduling data.

Example 8 includes the subject matter of example 4. In this example, the IoT device includes a traffic monitoring device.

Example 9 includes the subject matter of example 4. In this example, the IoT device includes a weather station.

Example 10 includes the subject matter of example 4. In this example, the IoT device includes a temperature sensor.

Example 11 includes the subject matter of any of examples 1 to 10. In this example, the apparatus includes a data aggregator to collect data from a number of instrumented substations.

Example 12 includes the subject matter of any of examples 1 to 11. In this example, the device includes a performance simulator to simulate forecasts of deployment strategies for instrumenting substations.

Example 13 includes the subject matter of example 12. In this example, the performance simulator creates a graph of deployment cost versus forecasting performance.

Example 14 includes the subject matter of any of examples 1 to 13. In this example, the device includes a sensor interface to couple to an external sensor.

Example 15 includes a method for forecasting data for a noninstrumented substation. The method includes determining a cluster id for a noninstrumented substation, creating a model from historic data for instrumented substations having the cluster id, and forecasting the data for the noninstrumented substation from the model.

Example 16 includes the subject matter of example 15. In this example, determining the cluster id includes accessing metadata for a number of substations, grouping the substations into a number of clusters, based, at least in part, on the metadata, and assigning the cluster id to each of the clusters.

Example 17 includes the subject matter of either of examples 15 or 16. In this example, the substations may be grouped into clusters by selecting metadata features related to power consumption, and performing a clustering algorithm to create the clusters.

Example 18 includes the subject matter of any of examples 15 to 17. In this example, metadata features may include average power, average inter-day correlation, area load classifications, work schedules, regional energy tariffs, weather data, seasonal data, or traffic patterns, or any combinations thereof.

Example 19 includes the subject matter of any of examples 15 to 18. In this example, the method may include creating a vector of features, wherein the vector of features includes a binary vector of clustering features and a binary vector of forecasting features, simulating a predictive performance across all substations, and determining if termination criteria have been met.

Example 20 includes the subject matter of any of examples 15 to 19. In this example, the method may include determining if the predictive performance has improved. If so, a current binary vector of clustering features may be copied into a best feature store. A random element in the current binary vector of clustering features may be selected and a feature bit for the random element inverted, and the simulation may be rerun.

Example 21 includes the subject matter of any of examples 15 to 20. In this example, creating the model includes aggregating the data for all of the instrumented substations having the cluster id, and creating the model from the aggregated data.

Example 22 includes the subject matter of any of examples 15 to 21. In this example, creating the model includes creating a model for each instrumented substation having the cluster id, and performing an individual forecast for a noninstrumented substation using each model.

Example 23 includes the subject matter of any of examples 15 to 22. In this example, forecasting the data may include aggregating the individual forecast for each noninstrumented substation to form an aggregated forecast.

Example 24 includes the subject matter of any of examples 15 to 23. In this example, the method includes generating a forecast for an instrumented substation.

Example 25 includes the subject matter of any of examples 15 to 24. In this example, the method may include creating a model for the instrumented substation from the historic data, and generating the forecast.

Example 26 includes the subject matter of any of examples 15 to 25. In this example, the method includes determining a deployment strategy for deploying instrumentation to a portion of a number of substations.

Example 27 includes the subject matter of any of examples 15 to 26. In this example, the method may include generating initial state features, iterating state features, evaluating average substation performance, determining if termination criteria have been met, and generating an implementation plan.

Example 28 includes the subject matter of any of examples 15 to 27. In this example, the method may include determining if cost constraints have reached 100%, and, if not, iterating cost constraints by a predetermined amount.

Example 29 includes the subject matter of any of examples 15 to 28. In this example, the implementation plan may include a graph of average substation performance versus deployment cost.

Example 30 includes a non-transitory, machine readable medium, including instructions to direct a processor to obtain metadata for a number of substations including both instrumented and noninstrumented substations. Instructions are included to direct the processor to create a cluster of substations based on the metadata, obtain historic data for the instrumented substations, and generate a forecast for a noninstrumented substation.

Example 31 includes the subject matter of example 30. In this example, the non-transitory, machine readable medium includes instructions to direct the processor to simulate performance for different distributions of instrumentation across the substations. Instructions are included to direct the processor to determine if termination criteria are met, and create a graph of performance versus deployment cost for the different distributions of instrumentation.

Example 32 includes an apparatus, including a device to forecast performance for a noninstrumented substation. The device includes a storage device to hold a historic database including historic data for instrumented substations. The storage device to hold a metadata database including metadata for the instrumented substations and for noninstrumented substations. The device includes a means for forecasting values for a noninstrumented substation from historic data generated from the instrumented substations.

Example 33 includes the subject matter of example 32. In this example, the apparatus includes a means to retrieve data from an external database.

Example 34 includes the subject matter of either of examples 32 or 33. In this example, the apparatus includes a means to obtain data from external sensors.

Example 35 includes the subject matter of any of examples 32 to 34. In this example, the apparatus includes a means to aggregate data from a number of instrumented substations.

Example 36 includes the subject matter of any of examples 32 to 35. In this example, the device includes a means to simulate forecasts of deployment strategies for instrumenting substations.

Example 37 includes a non-transitory, machine-readable medium including instructions to direct a processor in a node to perform any one of the methods of examples 15 to 29.

Example 38 includes an apparatus including means to perform any one of the methods of examples 15 to 29.

Example 39 includes the subject matter of any one of examples 1 to 14. In this example, the historic data comprises active power (P), reactive power (Q), voltage, apparent power (S), or voltage-ampere reactive (VAR), or any combinations thereof.

Example 40 includes the subject matter of any one of examples 15 to 29. In this example, the method includes measuring historic data for the instrumented substations, wherein the historic data comprises active power (P), reactive power (Q), voltage, apparent power (S), or voltage-ampere reactive (VAR), or any combinations thereof.

Example 41 includes the subject matter of any one of examples 15 to 29. In this example, the method includes forecasting an equipment failure in a noninstrumented substation, based, at least in part, on values measured at the instrumented substations for reactive power (Q), voltage, apparent power (S), or voltage-ampere reactive (VAR), or any combinations thereof.

Some embodiments may be implemented in one or a combination of hardware, firmware, and software. Some embodiments may also be implemented as instructions stored on a machine-readable medium, which may be read and executed by a computing platform to perform the operations described herein. A machine-readable medium may include any mechanism for storing or transmitting information in a form readable by a machine, e.g., a computer. For example, a machine-readable medium may include read only memory (ROM); random access memory (RAM); magnetic disk storage media; optical storage media; flash memory devices; or electrical, optical, acoustical or other form of propagated signals, e.g., carrier waves, infrared signals, digital signals, or the interfaces that transmit and/or receive signals, among others.

An embodiment is an implementation or example. Reference in the specification to "an embodiment," "one embodiment," "some embodiments," "various embodiments," or "other embodiments" means that a particular feature, structure, or characteristic described in connection with the embodiments is included in at least some embodiments, but not necessarily all embodiments, of the techniques. The various appearances of "an embodiment", "one embodiment", or "some embodiments" are not necessarily all referring to the same embodiments. Elements or aspects from an embodiment can be combined with elements or aspects of another embodiment.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

It is to be noted that, although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

The techniques are not restricted to the particular details listed herein. Indeed, those skilled in the art having the benefit of this disclosure will appreciate that many other variations from the foregoing description and drawings may be made within the scope of the present techniques. Accordingly, it is the following claims including any amendments thereto that define the scope of the techniques.

What is claimed is:

1. An apparatus, comprising a device to forecast performance for a noninstrumented substation, comprising:
   a storage device comprising a historic database comprising historic data for instrumented substations;
   the storage device comprising a metadata database comprising metadata for the instrumented substations and for noninstrumented substations;
   an unsupervised machine learning manager to generate a cluster of substations by metadata, wherein at least a portion of the substations in the cluster are noninstrumented substations; and
   a supervised machine learning manager to generate a forecast for a noninstrumented substation in the cluster from historic data generated from the instrumented substations,
   wherein generating the forecast comprises:
      creating a vector of features, wherein the vector of features comprises a binary vector of clustering features and a binary vector of forecasting features;
      simulating a predictive performance across all substations; and
      determining if termination criteria have been met to terminate the simulation.

2. The apparatus of claim 1, wherein the historic data comprises active power (P), reactive power (Q), voltage, apparent power (S), or voltage-ampere reactive (VAR), or any combinations thereof.

3. The apparatus of claim 1, wherein the device comprises an auxiliary data source manager to retrieve data from an external database in a cloud, an internet-of-things (IoT) device, or a sensor, or any combinations thereof.

4. The apparatus of claim 3, wherein the external database comprises weather data, metadata for substations, or scheduling data, or any combinations thereof.

5. The apparatus of claim 3, wherein the IoT device comprises a traffic monitoring device, a weather station, or a temperature sensor, or any combinations thereof.

6. The apparatus of claim 1, wherein the device comprises a performance simulator to simulate forecasts of deployment strategies for instrumenting substations.

7. The apparatus of claim 6, wherein the performance simulator creates a graph of deployment cost versus forecasting performance.

8. A method for forecasting data for a noninstrumented substation, comprising:
   accessing metadata for a plurality of substations;
   grouping the plurality of substations into a plurality of dusters, based, at least in part, on the metadata; and
   assigning the cluster id to each of the plurality of dusters;
   determining a cluster id for the noninstrumented substation;
   creating a model from historic data for instrumented substations having the duster id; and
   forecasting the data for the noninstrumentcd substation from the model;
   creating a vector of features, wherein the vector of features comprises a binary vector of clustering features and a binary vector of forecasting features;
   simulating a predictive performance across all substations; and determining if termination criteria have been met.

9. The method of claim 8, comprising measuring historic data for the instrumented substations, wherein the historic data comprises active power (P), reactive power (Q), voltage, apparent power (S), or voltage-ampere reactive (VAR), or any combinations thereof.

10. The method of claim 8, comprising forecasting an equipment failure in a noninstrumentcd substation, based, at least in part, on values measured at the instrumented substations for reactive power (Q), voltage, apparent power (S), or voltage-ampere reactive (VAR), or any combinations thereof.

11. The method of claim 8, wherein grouping the plurality of substations into the plurality of clusters comprises:
    selecting metadata features related to power consumption; and
    performing a clustering algorithm to create the clusters.

12. The method of claim 11, wherein the metadata features comprise average power, average inter-day correlation, area load classifications, work schedules, regional energy tariffs, weather data, seasonal data, or traffic patterns, or any combinations thereof.

13. The method of claim 8, comprising:
    determine if the predictive performance has improved; and, if so,
       copy a current binary vector of clustering features into a best feature store;

select a random element in the current binary vector of clustering features and Inver a feature bit; and
rerun the simulation.

14. The method of claim 8, wherein creating the model comprises:
aggregating the data for all of the instrumented substations having the cluster id; and
creating the model from the aggregated data.

15. The method of claim 8, wherein creating the model comprises:
creating a model for each instrumented substation having the cluster id; and
performing an individual forecast for the noninstrumented substation using each model.

16. The method of claim 15, Wherein forecasting the data comprises aggregating the individual forecast for each noninstrumented substation to form an aggregated forecast.

17. The method of claim 8, comprising generating a forecast for an instrumented substation.

18. The method of claim 17, comprising:
creating a model for the instrumented substation from the historic data; and
generating the forecast.

19. The method of claim 8, comprising determining a deployment strategy for deploying instrumentation to a portion of the plurality of substations.

20. The method of claim 19 comprising:
generating initial state features;
iterating state features;
evaluating average substation performance;
determining if termination criteria have been met; and
generating implementation plan.

21. The method of claim 20, wherein the implementation plan comprises a graph of average substation performance versus deployment cost.

22. A non-transitory, machine readable medium, comprising instructions, which when executed, direct a processor to:
obtain metadata for a plurality of substations comprising both instrumented and noninstrumented substations;
create a cluster of substations based on the metadata;
obtain historic data for the instrumented substations;
generate a forecast for a noninstrumented substation;
create a vector of features, wherein the vector of features comprises a binary vector of clustering features and a binary vector of forecasting features;
simulate a predictive performance across the plurality of substations; and
determining if termination criteria have been met.

23. The non-transitory, machine readable medium of claim 22, comprising instructions, which when executed, direct the processor to:
simulate performance for different distributions of instrumentation across the plurality of substations;
determine if termination criteria are met; and
create a graph of performance versus deployment cost for the different, distributions of instrumentation.

* * * * *

UNITED STATES PATENT AND TRADEMARK OFFICE
CERTIFICATE OF CORRECTION

PATENT NO. : 11,101,652 B2  
APPLICATION NO. : 16/307369  
DATED : August 24, 2021  
INVENTOR(S) : Kelly et al.

It is certified that error appears in the above-identified patent and that said Letters Patent is hereby corrected as shown below:

In the Claims

In Column 23, Line 65, in Claim 1, delete "features:" and insert --features;-- therefor In Column 24, Line 28, in Claim 8, delete "dusters," and insert --clusters,-- therefor In Column 24, Line 29, in Claim 8, delete "dusters;" and insert --clusters;-- therefor In Column 24, Line 33, in Claim 8, delete "duster" and insert --cluster-- therefor In Column 24, Line 34, in Claim 8, delete "noninstrumentcd" and insert --noninstrumented-- therefor In Column 24, Line 40, in Claim 8, after "and", insert a linebreak In Column 24, Line 48, in Claim 10, delete "noninstrumentcd" and insert --noninstrumented-- therefor In Column 25, Line 2, in Claim 13, delete "Inver" and insert --invert-- therefor In Column 25, Line 15, in Claim 16, delete "Wherein" and insert --wherein-- therefor In Column 26, Line 27, in Claim 23, delete "different," and insert --different-- therefor Signed and Sealed this  
Twenty-sixth Day of October, 2021

Drew Hirshfeld  
*Performing the Functions and Duties of the  
Under Secretary of Commerce for Intellectual Property and  
Director of the United States Patent and Trademark Office*